United States Patent
Woo et al.

(10) Patent No.: US 11,432,410 B2
(45) Date of Patent: Aug. 30, 2022

(54) PORTABLE COMMUNICATION DEVICE INCLUDING DISPLAY

(71) Applicant: SAMSUNG ELECTRONICS CO., LTD., Suwon-si (KR)

(72) Inventors: Jeong Woo, Suwon-si (KR); Jungchul An, Suwon-si (KR)

(73) Assignee: Samsung Electronics Co., Ltd., Suwon-si (KR)

(*) Notice: Subject to any disclaimer, the term of this patent is extended or adjusted under 35 U.S.C. 154(b) by 0 days.

(21) Appl. No.: 17/105,002

(22) Filed: Nov. 25, 2020

(65) Prior Publication Data
US 2021/0176872 A1 Jun. 10, 2021

(30) Foreign Application Priority Data

Dec. 5, 2019 (KR) .................. 10-2019-0160970
Feb. 10, 2020 (KR) .................. 10-2020-0015894

(51) Int. Cl.
*G06V 40/13* (2022.01)
*H05K 5/00* (2006.01)
(Continued)

(52) U.S. Cl.
CPC ....... *H05K 5/0017* (2013.01); *G06V 40/1306* (2022.01); *G06V 40/1318* (2022.01);
(Continued)

(58) Field of Classification Search
CPC .............. G06K 9/0004; G06K 9/00046; G06F 1/1652; G06F 1/1641; H01L 51/0097
See application file for complete search history.

(56) References Cited

U.S. PATENT DOCUMENTS 9,016,917 B2 4/2015 Fujita et al.
9,476,704 B2 10/2016 Choi et al.
(Continued)

FOREIGN PATENT DOCUMENTS

CN 108885376 A 11/2018
CN 109190563 A 1/2019
(Continued)

OTHER PUBLICATIONS

Extended European Search Report dated May 10, 2021 for EP Application No. 20209667.3.
(Continued)

*Primary Examiner* — Yuzhen Shen
(74) *Attorney, Agent, or Firm* — Nixon & Vanderhye P.C.

(57) ABSTRACT

A portable communication device includes: a foldable housing, a flexible display accommodated in the housing and including a first display area that remains substantially flat in a state in which the housing is folded and a second display area that is bendable as the housing is folded, a support located between the flexible display and the housing and including a first area corresponding to the first display area and having a first flexibility and a second area corresponding to the second display area and having a second flexibility greater than the first flexibility, wherein an opening is formed in the first area, and a sensing module accommodated in the housing and including a light receiving sensor at least partially aligned with the opening to sense light passing through the opening.

16 Claims, 18 Drawing Sheets

(51) Int. Cl.
  *G09G 3/32* (2016.01)
  *H01L 25/16* (2006.01)
  *H05K 5/02* (2006.01)

(52) U.S. Cl.
  CPC .......... *G09G 3/32* (2013.01); *G09G 2360/14* (2013.01); *G09G 2380/02* (2013.01); *H01L 25/167* (2013.01); *H05K 5/0226* (2013.01)

(56) References Cited

U.S. PATENT DOCUMENTS

| | | |
|---|---|---|
| 10,146,257 B2 | 12/2018 | Alonso et al. |
| 10,171,636 B2 | 1/2019 | Yeo et al. |
| 10,191,577 B2 | 1/2019 | Choi et al. |
| 10,642,313 B1* | 5/2020 | Wu .................. G06K 9/0002 |
| 10,747,380 B2 | 8/2020 | Lee et al. |
| 10,775,852 B2 | 9/2020 | Kim et al. |
| 11,016,527 B2 | 5/2021 | Park et al. |
| 11,048,294 B2 | 6/2021 | Yin et al. |
| 2009/0202183 A1* | 8/2009 | Hagino .................. B32B 27/32 383/211 |
| 2016/0132074 A1* | 5/2016 | Kim .................. G06F 1/1652 715/769 |
| 2017/0097660 A1 | 4/2017 | Alonso et al. |
| 2017/0235398 A1 | 8/2017 | Choi et al. |
| 2017/0289324 A1 | 10/2017 | Yeo et al. |
| 2017/0300736 A1* | 10/2017 | Song .................. G06K 9/0004 |
| 2018/0129798 A1* | 5/2018 | He .................. G06F 3/042 |
| 2018/0198896 A1* | 7/2018 | Kang .................. G06F 1/1652 |
| 2019/0067408 A1* | 2/2019 | Sun .................. G06K 9/0004 |
| 2019/0166703 A1 | 5/2019 | Kim et al. |
| 2019/0339739 A1 | 11/2019 | Park et al. |
| 2019/0360803 A1 | 11/2019 | Choi et al. |
| 2020/0117034 A1 | 4/2020 | Yin et al. |
| 2020/0133335 A1* | 4/2020 | Wu .................. G06K 9/0002 |
| 2021/0142027 A1 | 5/2021 | Wang et al. |

FOREIGN PATENT DOCUMENTS

| | | | |
|---|---|---|---|
| CN | 109542262 A | 3/2019 | |
| CN | 109841152 A | 6/2019 | |
| CN | 110114779 A * | 8/2019 | .............. G06K 9/00 |
| CN | 110445898 A | 11/2019 | |
| EP | 2 675 140 A1 | 12/2013 | |
| EP | 3 489 795 A1 | 5/2019 | |
| EP | 3 609 165 A1 | 2/2020 | |
| JP | 2016164626 A | 9/2016 | |
| KR | 20170096565 A | 8/2017 | |
| KR | 10-2018-0034109 A | 4/2018 | |
| WO | WO 2018-196149 | 11/2018 | |

OTHER PUBLICATIONS

PCT International Search Report dated Mar. 9, 2021 for PCT/KR2020/016973; 9pgs.
Chinese Office Action dated Nov. 22, 2021 for CN Application No. 202011380631.2.
Chinese Notice of Allowance dated May 5, 2022 for CN Application No. 202011380631.2.

* cited by examiner

PORTABLE COMMUNICATION DEVICE INCLUDING DISPLAY

CROSS-REFERENCE TO RELATED APPLICATIONS

This application is based on and claims priority under 35 U.S.C. § 119 to Korean Patent Application No. 10-2019-0160970, filed on Dec. 5, 2019, and Korean Patent Application No. 10-2020-0015894, filed on Feb. 10, 2020 in the Korean Intellectual Property Office, the disclosures of which are incorporated by reference herein their entireties.

BACKGROUND

1. Field

The disclosure relates to a portable communication device including a display.

2. Description of Related Art

An electronic device (e.g., a smartphone) may include a display to display a screen. For example, the display may be disposed on almost the entire front of the electronic device. In this case, various sensors (e.g., an illuminance sensor, a proximity sensor, and a biometric sensor) may be disposed on the remaining portion of the front of the electronic device.

With an increase in demands for a large screen, a display may be disposed on the entire front of an electronic device. In the case where the display is disposed on the entire front of the electronic device, various sensors (e.g., an illuminance sensor, a proximity sensor, and a biometric sensor) may be disposed on the rear of the display. Furthermore, a flexible display may be applied to the electronic device to achieve a large screen.

With regard to the application of the flexible display, in a case where a front plate (e.g., a polyimide (PI) film) having less than a specified rigidity is disposed on the front of the electronic device, not only the flexible display but also the various sensors disposed on the rear of the flexible display may be damaged by an external force applied to the front plate.

The above information is presented as background information only to assist with an understanding of the disclosure. No determination has been made, and no assertion is made, as to whether any of the above might be applicable as prior art with regard to the disclosure.

SUMMARY

Embodiments of the disclosure address at least the above-mentioned problems and/or disadvantages and to provide at least the advantages described below. Accordingly, embodiments of the disclosure provide a portable communication device including a display having various sensors disposed on the rear thereof.

In accordance with an example of the disclosure, a portable communication device includes: a foldable housing, a flexible display accommodated in the housing and including a first display area that remains substantially flat in a state in which the housing is folded and a second display area that is bendable as the housing is folded, a support located between the flexible display and the housing including a first area corresponding to the first display area and having a first flexibility and a second area corresponding to the second display area and having a second flexibility greater than the first flexibility, wherein an opening formed in the first area, and a sensing module accommodated in the housing and including a light receiving sensor at least partially aligned with the opening and configured to sense light passing through the opening.

In accordance with another example embodiment of the disclosure, an electronic device includes: a first housing, a second housing, a hinge housing disposed between the first housing and the second housing, a hinge coupled with the first housing and the second housing, at least portion of the hinge being disposed in the hinge housing, a display panel, at least portion of which is disposed on the first housing and the second housing, a first support disposed under the display panel and including a first opening, a second support disposed under the first support and including a second opening, a sensor module including at least one sensor and configured to receive a signal through the first opening, the second opening, and the display panel, and a reinforcing support disposed between the display panel and the sensor module.

Other aspects, advantages, and salient features of the disclosure will become apparent to those skilled in the art from the following detailed description, which, taken in conjunction with the annexed drawings, discloses various embodiments of the disclosure.

BRIEF DESCRIPTION OF THE DRAWINGS

The above and other aspects, features, and advantages of certain embodiments of the present disclosure will be more apparent from the following detailed description, taken in conjunction with the accompanying drawings, in which.

DETAILED DESCRIPTION

Hereinafter, various example embodiments of the disclosure will be described with reference to accompanying drawings. Accordingly, those of ordinary skill in the art will recognize that various modifications, equivalents, and/or alternatives on the various example embodiments described herein may be variously made without departing from the scope and spirit of the disclosure.

Figure 1A:
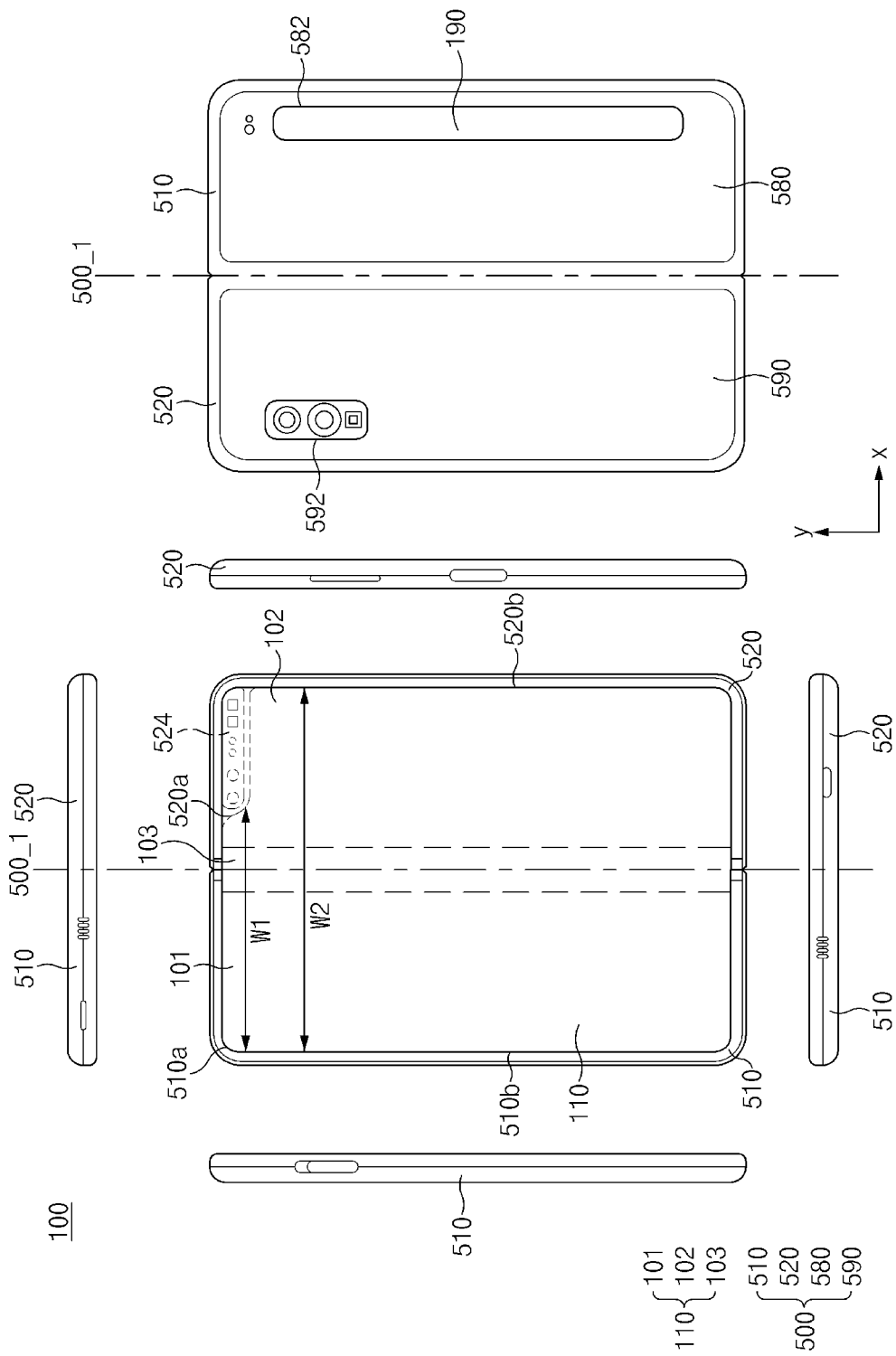
FIG. 1A is a diagram illustrating a flat state of an example electronic device according to various embodiments.
Figure 1B:
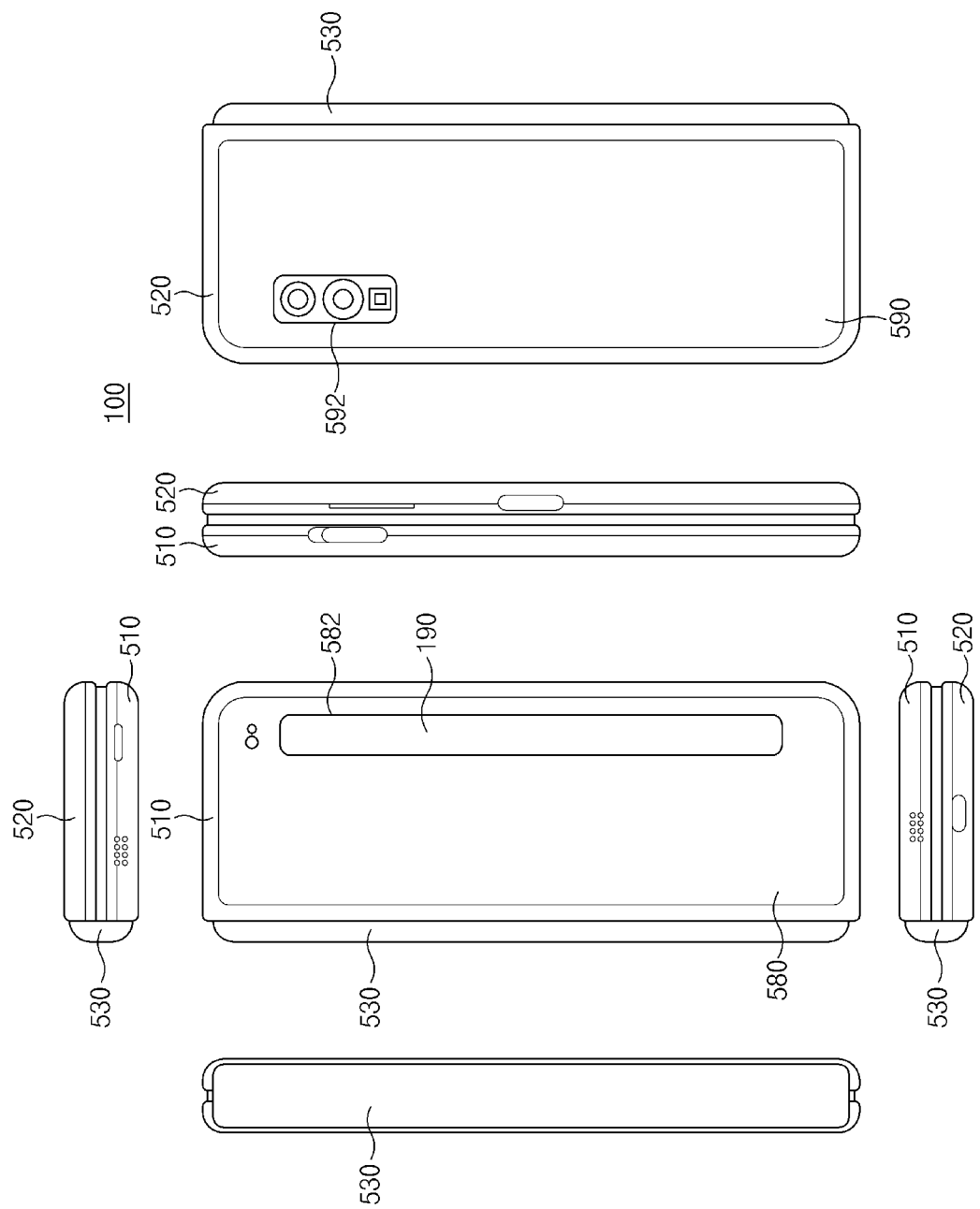
FIG. 1B is a diagram illustrating a folded state of the electronic device according to various embodiments.

FIG. 1A is a diagram illustrating a flat state of an example foldable electronic device according to various embodiments. FIG. 1B is a diagram illustrating a folded state of the foldable electronic device according to various embodiments.

Referring to FIGS. 1A and 1B, in an embodiment, the electronic device 100 may include a foldable housing 500, a hinge cover 530 (or, a hinge housing) that covers a foldable portion of the foldable housing 500, and a flexible or foldable display 110 (hereinafter, abbreviated to the "display" 110) that is disposed in a space formed by the foldable housing 500. In this disclosure, a surface on which the display 110 is disposed may be referred to, for example, as a first surface or a front surface of the electronic device 100. An opposite surface to the front surface may be referred to, for example, as a second surface or a rear surface of the electronic device 100. Surfaces that surround at least portion of a space between the front surface and the rear surface may be referred to, for example, as third surfaces or side surfaces of the electronic device 100.

In an embodiment, the foldable housing 500 may include a first housing structure (e.g., a first housing) 510, a second housing structure (e.g., including a second housing) 520 including at least portion of a sensor area 524, a first back cover 580, and a second back cover 590. The foldable housing 500 of the electronic device 100 is not limited to the form and coupling illustrated in FIGS. 1A and 1B and may be implemented by a combination and/or coupling of other shapes or parts. For example, in an embodiment, the first housing structure 510 and the first back cover 580 may be integrated with each other, and the second housing structure 520 and the second back cover 590 may be integrated with each other.

In the illustrated embodiment, the first housing structure 510 and the second housing structure 520 may be disposed on opposite sides of a virtual folding axis 500_1 and may have shapes that are entirely symmetric to each other with respect to the folding axis 500_1. As will be described below, the angle between the first housing structure 510 and the second housing structure 520 or the distance from one point of the first housing structure 510 to one point of the second housing structure 520 may vary depending on whether the electronic device 100 is in a flat state, a folded state, or a specific mounting state. In the illustrated embodiment, unlike the first housing structure 510, the second housing structure 520 may additionally include the sensor area 524 in which various sensors are disposed. However, the first housing structure 510 and the second housing structure 520 may have mutually symmetrical shapes in the other area.

In an embodiment, as illustrated in FIG. 1A, the first housing structure 510 and the second housing structure 520 may form a recess in which the display 110 is accommodated. In the illustrated embodiment, due to the sensor area 524, the recess may have two or more different widths in a direction perpendicular to the folding axis 500_1.

For example, the recess may have (1) a first width W1 between a first portion 510a of the first housing structure 510 that is parallel to the folding axis 500_1 and a first portion 520a of the second housing structure 520 that is formed on the periphery of the sensor area 524 and (2) a second width W2 formed by a second portion 510b of the first housing structure 510 and a second portion 520b of the second housing structure 520 that does not correspond to the sensor area 524 and that is parallel to the folding axis 500_1. In this case, the second width W2 may be greater than the first width W1. The first portion 510a of the first housing structure 510 and the first portion 520a of the second housing structure 520 that have mutually asymmetrical shapes may form the first width W1 of the recess, and the second portion 510b of the first housing structure 510 and the second portion 520b of the second housing structure 520 that have mutually symmetrical shapes may form the second width W2 of the recess. In an embodiment, the first portion 520a and the second portion 520b of the second housing structure 520 may have different distances from the folding axis 500_1. The width of the recess is not limited to the illustrated example. In various embodiments, the recess may have a plurality of widths depending on the form of the sensor area 524 or the asymmetrical portions of the first housing structure 510 and the second housing structure 520.

In an embodiment, at least portion of the first housing structure 510 and at least portion of the second housing structure 520 may be formed of a metallic material or a non-metallic material that has a stiffness selected to support the display 110.

In an embodiment, the sensor area 524 may have a predetermined area formed adjacent to one corner of the second housing structure 520. However, the arrangement, shape, and size of the sensor area 524 are not limited to the illustrated example. For example, in an embodiment, the sensor area 524 may be provided in another corner of the second housing structure 520 or in any area between an upper corner and a lower corner of the second housing structure 520. In an embodiment, parts embedded in the electronic device 100 to perform various functions may be exposed on the front surface of the electronic device 100 through the sensor area 524 or through one or more openings formed in the sensor area 524. In various embodiments, the parts may include various types of sensors. The sensors may include, for example, at least one of a front camera, a receiver, or a proximity sensor. According to various embodiments, the sensor area 524 may be disposed under the display 110, and at least portion of the sensor area 524 may be hidden by the display 110. Alternatively, the sensor area 524 may be exposed to the outside without being hidden by the display 110. In this case, a partial area of the display 110 having an overall rectangular shape may be cut so as not to hide the sensor area 524. In this case, the sensor area 524 may be mounted on one side of a printed circuit board disposed inside the second housing structure 520.

The first back cover 580 may be disposed on one side of the folding axis 500_1 on the rear surface of the electronic device 100. For example, the first back cover 580 may have a substantially rectangular periphery, and the periphery may be surrounded by the first housing structure 510. Similarly, the second back cover 590 may be disposed on an opposite side of the folding axis 500_1 on the rear surface of the electronic device 100. The second back cover 590 may have a periphery surrounded by the second housing structure 520.

In the illustrated example embodiment, the first back cover 580 and the second back cover 590 may have substantially symmetrical shapes with respect to the folding axis 500_1. However, the first back cover 580 and the second back cover 590 do not necessarily have to have mutually symmetrical shapes. In an embodiment, the electronic device 100 may include the first back cover 580 and the second back cover 590 that have various shapes. In an embodiment, the first back cover 580 may be integrally formed with the first housing structure 510, and the second back cover 590 may be integrally formed with the second housing structure 520.

In an embodiment, the first back cover 580, the second back cover 590, the first housing structure 510, and the second housing structure 520 may form a space in which various parts (e.g., a printed circuit board or a battery) of the electronic device 100 are disposed. In an embodiment, one or more parts may be disposed, or visually exposed, on the rear surface of the electronic device 100. For example, at least portion of a sub-display 535 may be visually exposed through a first rear area 582 of the first back cover 580. In an embodiment, one or more parts or sensors may be visually exposed through a second rear area 592 of the second back cover 590. In various embodiments, the sensors may include a proximity sensor and/or a rear camera.

Referring to FIG. 1B, the hinge cover 530 may be disposed between the first housing structure 510 and the second housing structure 520 and may be configured to hide an internal part (e.g., a hinge structure). In an embodiment, the hinge cover 530 may be hidden by part of the first housing structure 510 and part of the second housing structure 520, or may be exposed to the outside, depending on a state (e.g., a flat state or an unfolded state, or a folded state) of the electronic device 100.

For example, when the electronic device 100 is in a flat state as illustrated in FIG. 1A, the hinge cover 530 may not be exposed to the outside by being hidden by the first housing structure 510 and the second housing structure 520. In another example, when the electronic device 100 is in a folded state (e.g., a fully folded state) as illustrated in FIG. 1B, the hinge cover 530 may be exposed to the outside from between the first housing structure 510 and the second housing structure 520. In another example, when the electronic device 100 is in an intermediate state in which the first housing structure 510 and the second housing structure 520 are folded with a certain angle, part of the hinge cover 530 may be exposed to the outside from between the first housing structure 510 and the second housing structure 520. However, in this case, the exposed area may be smaller than that when the electronic device 100 is in the fully folded state. In an embodiment, the hinge cover 530 may include a curved surface.

The display 110 may be disposed in the space formed by the foldable housing 500. For example, the display 110 may be mounted in the recess formed by the foldable housing 500 and may form almost the entire front surface of the electronic device 100.

Accordingly, the front surface of the electronic device 100 may include the display 110, and a partial area of the first housing structure 510 and a partial area of the second housing structure 520 that are adjacent to the display 110. Further, the rear surface of the electronic device 100 may include the first back cover 580, a partial area of the first housing structure 510 that is adjacent to the first back cover 580, the second back cover 590, and a partial area of the second housing structure 520 that is adjacent to the second back cover 590.

The display 110 may refer to a display, at least portion of which is able to be deformed into a flat surface or a curved surface. In an embodiment, the display 110 may include a folding area 103, a first area 101 disposed on one side of the folding area 103 (on a left side of the folding area 103 illustrated in FIG. 1A), and a second area 102 disposed on an opposite side of the folding area 103 (on a right side of the folding area 103 illustrated in FIG. 1A).

The areas of the display 110 illustrated in FIG. 1A are illustrative, and the display 110 may be divided into a plurality of areas (e.g., four or more areas, or two areas) depending on the structure or function of the display 110. For example, in the embodiment illustrated in FIG. 1A, the areas of the display 110 may be divided from each other by the folding area 103 extending parallel to the y-axis or by the folding axis 500_1. However, in an embodiment, the display 110 may be divided into areas with respect to another folding area (e.g., a folding area parallel to the x-axis) or another folding axis (e.g., a folding axis parallel to the x-axis).

The first area 101 and the second area 102 may have shapes that are entirely symmetric to each other with respect to the folding area 103. However, unlike the first area 101, the second area 102 may include a notch that is cut depending on the presence of the sensor area 524. However, in the other area, the second area 102 may have a shape symmetric to the shape of the first area 101. The first area 101 and the second area 102 may include a portion having a symmetrical shape and a portion having an asymmetrical shape. According to various embodiments, in a case where the sensor area 524 is disposed under the display 110, the first area 101 and the second area 102 may have symmetrical shapes.

Hereinafter, operations of the first housing structure 510 and the second housing structure 520 and the areas of the display 110 depending on states (e.g., a flat state and a folded state) of the electronic device 100 will be described in greater detail.

In an embodiment, when the electronic device 100 is in a flat state (e.g., FIG. 1A), the first housing structure 510 and the second housing structure 520 may be disposed to face the same direction while forming an angle of 180 degrees. The surface of the first area 110 and the surface of the second area 102 of the display 110 may face the same direction (e.g., a direction toward the front surface of the electronic device 100) while forming an angle of 180 degrees. The folding area 103, together with the first area 101 and the second area 102, may form the same plane.

In an embodiment, when the electronic device 100 is in a folded state (e.g., FIG. 1B), the first housing structure 510 and the second housing structure 520 may be disposed to face each other. The surface of the first area 110 and the surface of the second area 102 of the display 110 may face each other while forming a narrow angle (e.g., an angle between 0 degrees and 10 degrees). At least portion of the folding area 103 may be formed to be a curved surface having a predetermined curvature.

In an embodiment, when the electronic device 100 is in an intermediate state, the first housing structure 510 and the second housing structure 520 may be disposed to form a certain angle. The surface of the first area 110 and the surface of the second area 102 of the display 110 may form an angle that is greater than that in the folded state and is smaller than that in the flat state. At least portion of the folding area 103 may be formed to be a curved surface having a predetermined curvature, and the curvature may be smaller than that in the folded state.

According to various embodiments, a flexible display accommodated in the housing may include a first display area (e.g., at least one of the first area 101 or the second area 102) that remains substantially flat in a state in which the housing is folded and a second display area (e.g., the folding area 103) that is bendable as the housing is folded.

According to various embodiments, a support member (e.g., a first support member 137 of FIG. 3) that is located between the flexible display and the housing may include a first area (e.g., the first area 101 or the second area 102) that corresponds to the first display area (the area that remains flat) and has a first flexibility and a second area (e.g., the folding area 103) that corresponds to the second display area (the bendable area) and has a second flexibility higher than the first flexibility.

Figure 1C:
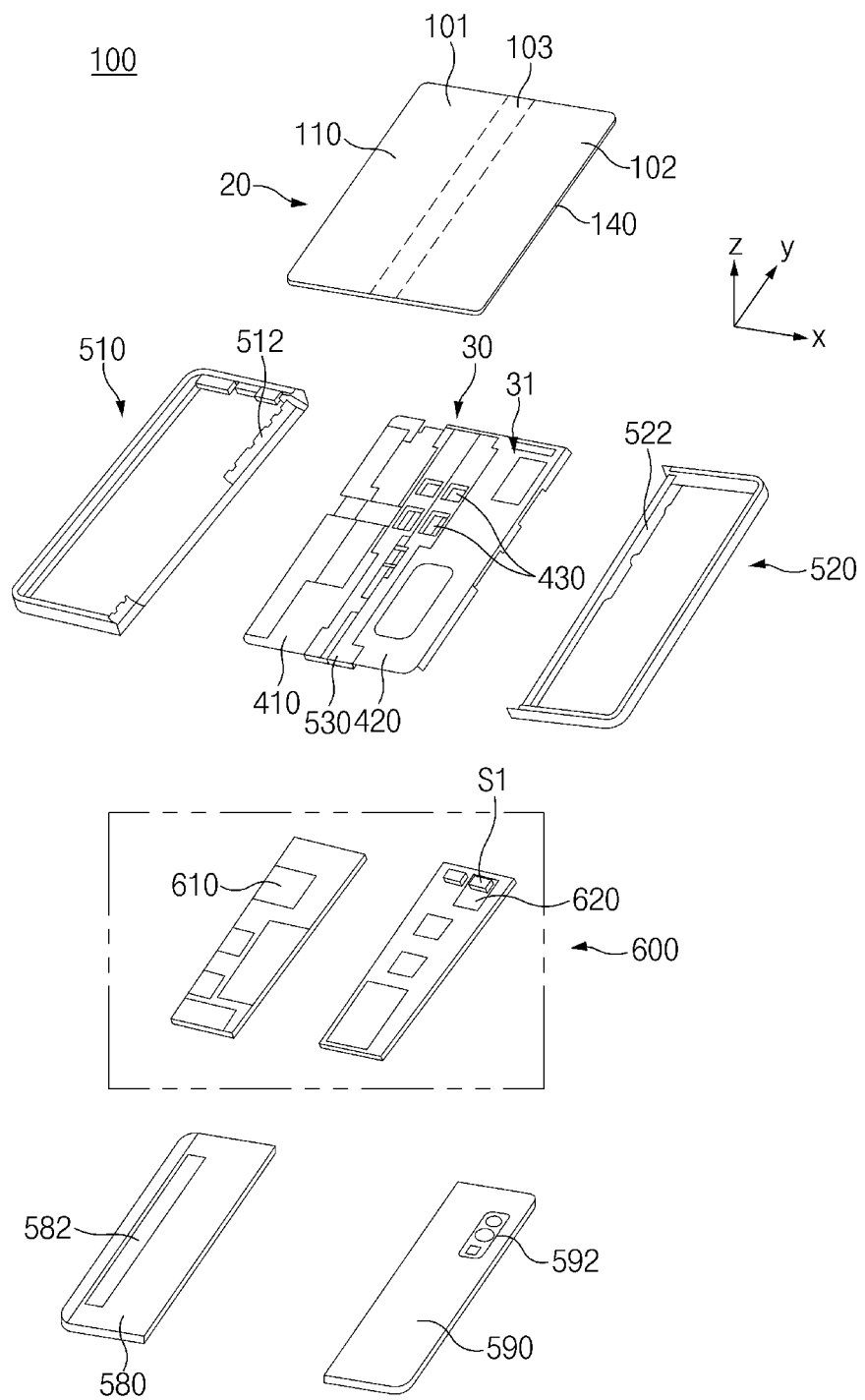
FIG. 1C is an exploded perspective view of the electronic device according to various embodiments.

FIG. 1C is an exploded perspective view of the electronic device according to various embodiments.

Referring to FIG. 1C, in an embodiment, the electronic device 100 may include a display unit 20, a bracket assembly 30, a circuit board 600, the first housing structure 510, the second housing structure 520, the first back cover 580, and the second back cover 590. In this disclosure, the display unit 20 may be referred to as the display module or the display assembly.

The display unit 20 may include the display 110 and at least one plate or layer 140 on which the display 110 is mounted. In an embodiment, the plate 140 may be disposed between the display 110 and the bracket assembly 30. The display 110 may be disposed on at least portion of one surface of the plate 140 (e.g., an upper surface of the plate 140 that faces the z-axis direction with respect to FIG. 1C). The plate 140 may be formed in a shape corresponding to the display 110.

The bracket assembly 30 may include a first bracket 410, a second bracket 420, a hinge structure (e.g., a hinge) disposed between the first bracket 410 and the second bracket 420, the hinge cover 530 that covers the hinge structure when viewed from the outside, and wiring members 430 (e.g., flexible printed circuits (FPCs)) across at least portion of the first bracket 410 and at least portion of the second bracket 420.

In an embodiment, the bracket assembly 30 may be disposed between the plate 140 and the circuit board 600. For example, the first bracket 410 may be disposed between the first area 110 of the display 110 and a first circuit board 610. The second bracket 420 may be disposed between the second area 102 of the display 110 and a second circuit board 620.

In an embodiment, at least portions of the wiring members 430 and at least portion of the hinge structure may be disposed inside the bracket assembly 30. The wiring members 430 may be disposed in a direction (e.g., the x-axis direction) across the first bracket 410 and the second bracket 420. The wiring members 430 may be disposed in a direction (e.g., the x-axis direction) that is perpendicular to a folding axis (e.g., the y-axis or the folding axis 500_1 of FIG. 1A) of the folding area 103 of the electronic device 100. According to various embodiments, a sensor hole 31 for a sensor arrangement may be formed in an up-down direction (e.g., the z-axis direction) on one side of the second bracket 420.

The circuit board 600, as mentioned above, may include the first circuit board 610 disposed on one side of the first bracket 410 and the second circuit board 620 disposed on one side of the second bracket 420. The first circuit board 610 and the second circuit board 620 may be disposed in a space formed by the bracket assembly 30, the first housing structure 510, the second housing structure 520, the first back cover 580, and the second back cover 590. Parts for implementing various functions of the electronic device 100 may be mounted on the first circuit board 610 and the second circuit board 620. According to various embodiments, at least one sensor S1 may be disposed on one side of the second circuit board 620. The at least one sensor S1 may be disposed on a rear surface of the display 110 (e.g., under the second area 102 of the display 110) through the sensor hole 31.

In a state in which the display unit 20 is coupled to the bracket assembly 30, the first housing structure 510 and the second housing structure 520 may be assembled together so as to be coupled to opposite sides of the bracket assembly 30. As will be described below, the first housing structure 510 and the second housing structure 520 may be coupled to the bracket assembly 30 by sliding on the opposite sides of the bracket assembly 30.

In an embodiment, the first housing structure 510 may include a first rotation support surface 512, and the second housing structure 520 may include a second rotation support surface 522 corresponding to the first rotation support surface 512. The first rotation support surface 512 and the second rotation support surface 522 may each include a curved surface corresponding to the curved surface included in the hinge cover 530.

In an embodiment, when the electronic device 100 is in a flat state (e.g., the electronic device 100 of FIG. 1A), the first rotation support surface 512 and the second rotation support surface 522 may cover the hinge cover 530 such that the hinge cover 530 is not exposed, or is minimally exposed, on the rear surface of the electronic device 100. Meanwhile, when the electronic device 100 is in a folded state (e.g., the electronic device 100 of FIG. 1B), the first rotation support surface 512 and the second rotation support surface 522 may rotate along the curved surface included in the hinge cover 530 such that the hinge cover 530 is maximally exposed on the rear surface of the electronic device 100.

Figure 1D:
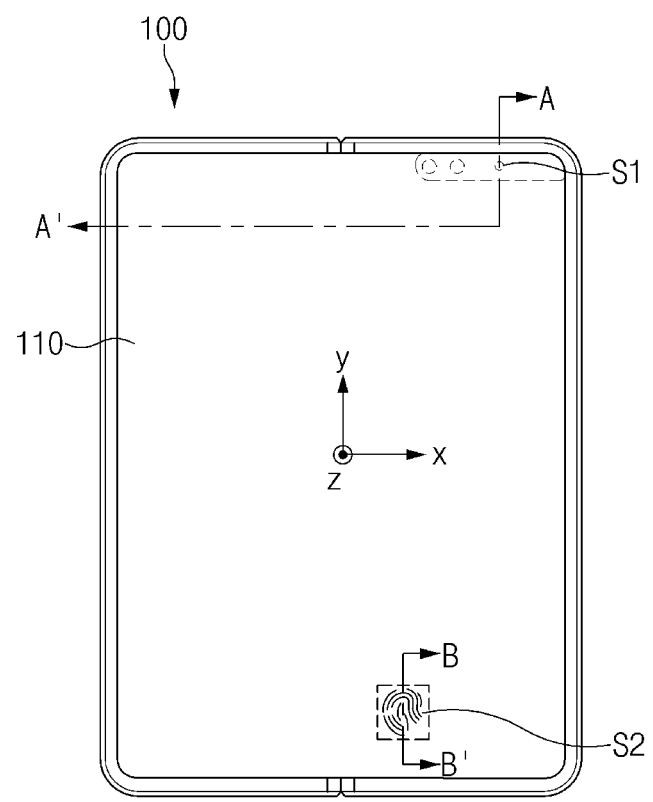
FIG. 1D is a diagram illustrating the electronic device according to various embodiments.

FIG. 1D is a diagram illustrating the electronic device according to various embodiments.

Referring to FIG. 1D, the electronic device 100 according to an embodiment may include the display 110 and a sensor module (e.g., a first sensor module S1 and/or a second sensor module S2).

According to an embodiment, the display 110 may be disposed on the front surface (e.g., the surface facing the z-axis direction) of the electronic device 100. For example, the display 110 may be disposed on a front surface of the sensor module (e.g., the first sensor module S1 and/or the second sensor module S2). Accordingly, at least portion of the sensor module (e.g., the first sensor module S1 and/or the second sensor module S2) may be hidden by the display 110.

According to various embodiments, the sensor module (e.g., the first sensor module S1 and/or the second sensor module S2) may be a sensing module (e.g., the first sensor module S1 and/or the second sensor module S2).

According to various embodiments, the display 110 may have a folding area formed in any one direction (e.g., the y-axis direction in the center of the display 110). For example, the folding area may include a predetermined area located in a central portion of a screen display area in a case where an arrangement state (e.g., a folded state or a flat state) of the display 110 is changed.

According to an embodiment, the sensor module may be identified as the first sensor module S1 or the second sensor module S2 depending on the type of sensor included (e.g., an illuminance sensor, a proximity sensor, an image sensor (or, a camera sensor), or a fingerprint recognition sensor). According to an embodiment, the first sensor module S1 may be disposed on a rear surface of one side (e.g., an upper periphery) of the display 110 (or, under the surface of the display 110 that faces the −z-axis direction). For example, the first sensor module S1 may transmit a signal (e.g., light) to a target disposed on the front surface (e.g., the surface facing the z-axis direction) of the electronic device 100 through the display 110, or may receive a signal (e.g., light) from the target through the display 110. According to various embodiments, the first sensor module S1 may include at least one of an illuminance sensor or a proximity sensor. For example, in a case where the first sensor module S1 includes an illuminance sensor, the first sensor module S1 may sense the brightness around the front surface of the electronic device 100 by receiving a signal (e.g., light) through the display 110 in a direction away from the front surface (e.g., the surface facing the z-axis direction) of the electronic device 100. In another example, in a case where the first sensor module S1 includes a proximity sensor, the first sensor module S1 may sense the distance from an approaching object by measuring the distance from the object approaching a front surface of the display 110 (e.g., from the z-axis direction to the −z-axis direction) by transmitting and receiving a specified signal.

According to an embodiment, the second sensor module S2 may be disposed on a rear surface of an opposite side (e.g., a lower periphery) of the display 110. For example, the second sensor module S2 may obtain image information of a target (e.g., image information of a fingerprint) through the display 110 from the target brought into contact with the front surface (e.g., the surface facing the z-axis direction) of the electronic device 100. In a case where the second sensor module S2 includes a fingerprint recognition sensor, the second sensor module S2 may support execution of a function (e.g., a user authentication function) of the electronic device 100 by obtaining fingerprint information from a target brought into contact with the front surface (e.g., the surface facing the z-axis direction) of the display 110 of the electronic device 100. The fingerprint recognition sensor may obtain image information of a fingerprint by various methods such as an optical method, a semiconductor element method, an ultrasonic method, a heat detection method, or a combination thereof. According to various embodiments, the first sensor module S1 or the second sensor module S2 may be installed on a circuit board (e.g., 600 of FIG. 1C). According to various embodiments, the first sensor module S1 and the second sensor module S2 are not limited to the positions in the illustrated drawing. For example, the second sensor module S2 may be disposed at the position where the first sensor module S1 is disposed in the illustrated drawing or in an area adjacent to the first sensor module S1, and the first sensor module S1 may be disposed at the position where the second sensor module S2 is disposed in the illustrated drawing or in an area adjacent to the second sensor module S2.

Figure 2:
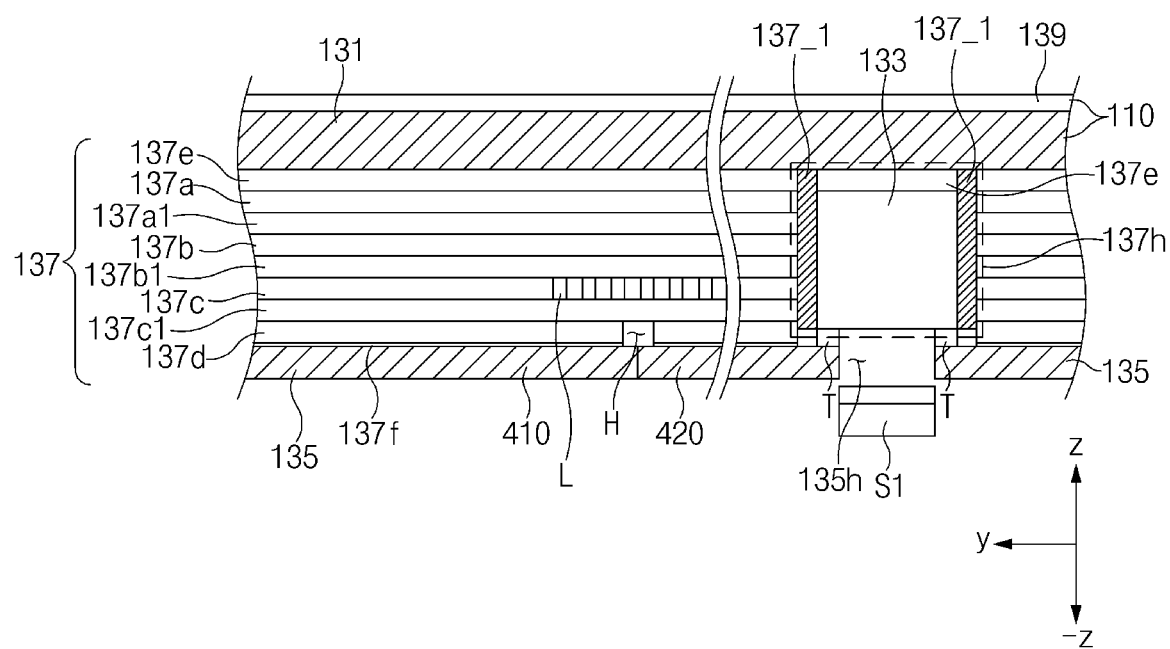
FIG. 2 is a sectional diagram illustrating an example electronic device according to various embodiments.

FIG. 2 is a sectional diagram illustrating a section of an electronic device according to various embodiments. For example, FIG. 2 is a view illustrating an example of a section taken along line A-A' or B-B' of FIG. 1D.

Referring to FIG. 2, at least portion of the electronic device (e.g., the electronic device 100 of FIG. 1D) may include the display 110 (a display panel 131 and a front plate 139), a first reinforcing member (e.g., a reinforcing support) 133, a first support member (e.g., support) 137, a second support member 135 (e.g., the bracket 410 or 420 of FIG. 1C), and the first sensor module S1. The electronic device 100, as described above, may further include the circuit boards 610 and 620 on which the first sensor module S1 is mounted and the back covers 580 and 590. According to an embodiment, at least portion of the display panel 131 may be disposed on the front surface (e.g., the surface facing the z-axis direction) of the electronic device 100 in a flat state. Furthermore, the first support member 137 may be disposed on a rear surface (e.g., the surface facing the −z-axis direction) of the display panel 131. With regard to an arrangement of the first reinforcing member 133, the first support member 137 may have a first opening 137h formed therein. At least portion of the first reinforcing member (e.g., reinforcing support) 133 may be disposed in the first opening 137h formed in the first support member 137.

According to an embodiment, at least portion of the first reinforcing member 133 (e.g., a transparent member 133) may be disposed in the first opening 137h formed in the first support member 137, and the first reinforcing member 133 may be disposed to face toward the rear surface (e.g., the surface facing the −z-axis direction) of the display panel 131.

According to an embodiment, the electronic device 100 may include the transparent member 133 (e.g., the first reinforcing member 133) attached to at least portion of an inner surface that forms the first opening 137h of the first support member 137.

According to an embodiment, in a case where the first reinforcing member 133 has a smaller height than the first opening 137h of the first support member 137, a height adjustment part T (or, a height reinforcement part or a height correction part) may be disposed on one side of the first reinforcing member 133 to complement a step between the first reinforcing member 133 and a rear surface (e.g., the surface facing the −z-axis direction) of the first support member 137. According to various embodiments, with regard to fixing the first reinforcing member 133, at least portion of the height adjustment part T may include an adhesive tape or a double-sided tape. An adhesive member 137_1 may be disposed between the first reinforcing member 133 and the first support member 137.

According to an embodiment, the first opening 137h formed in the first support member 137 may be formed by removing at least portion of the first support member 137. For example, the first support member 137 may include at least one of a base layer 137a, a cushion layer 137b, a third support member 137c, and/or a fourth support member 137d. For example, according to various embodiments, the first support member 137 may include only the base layer 137a and the cushion layer 137b. The first support member 137 may include only the base layer 137a, the cushion layer 137b, and the third support member 137c. In another case, the first support member 137 may include only the cushion layer 137b and the fourth support member 137d.

According to various embodiments, the first support member 137 may include at least one adhesive member or adhesive layer (at least one of 137e, 137a1, 137b1, or 137c1) that is disposed on the top of the base layer 137a, between the base layer 137a and the cushion layer 137b, between the cushion layer 137b and the third support member 137c, between the third support member 137c and the fourth support member 137d, and/or on the bottom of the fourth support member 137d. The first opening 137h may be formed by removing at least one of the base layer 137a, the cushion layer 137b, the third support member 137c, or the fourth support member 137d and the at least one adhesive member or adhesive layer (at least one of 137e, 137a1, 137b1, or 137c1). According to an embodiment, the adhesive layer (at least one of 137e, 137a1, 137b1, or 137c1) may be a pressure sensitive adhesive (PSA) having adhesiveness. Furthermore, the adhesive layer (at least one of 137e, 137a1, 137b1, or 137c1) may be disposed between the display panel 131 and the first reinforcing member 133 and may fix the first reinforcing member 133 to the rear surface of the display panel 131.

According to an embodiment, the base layer 137a may be disposed under the display panel 131. At least portion of the base layer 137a may be attached to the bottom of the display panel 131 through the adhesive layer 137e. The base layer 137a may absorb stress or tensile force generated while the display panel 131 is folded or unfolded, or may support the display panel 131. The base layer 137a may be formed of, for example, polyimide (PI).

According to an embodiment, the cushion layer 137b may be disposed under the base layer 137a (e.g., under the surface of the base layer 137a that faces the −z-axis direction). The cushion layer 137b may absorb at least portion of an external force applied to the display panel 131. The cushion layer 137b may be formed of, for example, sponge or rubber having elasticity. The cushion layer 137b may be implemented with an embo layer.

According to an embodiment, the third support member 137c may be disposed under the cushion layer 137b (e.g., under the surface of the cushion layer 137b that faces the −z-axis direction). At least portion of the third support member 137c may include at least one of a structure including a plurality of openings, a grid structure including a plurality of gaps or cracks, a grid structure by a plurality of lattices, a grid structure by a plurality of slits, or a structure including at least one recess partly having a smaller thickness than a surrounding area. A lattice area L of the third support member 137c in which the grid structure is disposed may correspond to a folding area of the display panel 131 (e.g., the folding area described above with reference to FIG. 1A). According to various embodiments, areas of the third support member 137c that correspond to the first area 101 of the display 110 and the second area 102 of the display 110 may have the form of a sheet of a solid type or a metal panel (or, a metal plate), and an area of the third support member 137c that corresponds to the folding area (e.g., the folding area 103 of FIG. 1A) may include the lattice area L. The lattice area L may be formed to be wider than the folding area (e.g., the folding area 103 of FIG. 1A). Accordingly, at least portion of the lattice area L may overlap the first area 101 or the second area 102 in the up-down direction (or, the z-axis direction).

According to various embodiments, the third support member 137c corresponding to the folding area 103 of the display 110 may not include the separate lattice area L. In this case, likewise to the fourth support member 137d, the third support member 137c corresponding to the folding area 103 may have a form in which a central portion (e.g., the folding axis 500_1) is cut away. According to various embodiments, the folding area 103 may be formed of a bendable material (or, a material that is bendable and has a predetermined flexibility).

According to an embodiment, the fourth support member 137d may be disposed under the third support member 137c (e.g., under the surface of the third support member 137c that faces the −z-axis direction). For example, in a case where an external force is applied to the display panel 131, the fourth support member 137d may serve to absorb shocks such that the applied external force is not transmitted to the first sensor module S1, or may serve to protect the first sensor module S1. The fourth support member 137d may include a folding gap H. For example, the folding gap H may be formed in a position corresponding to the lattice area L of the third support member 137c that corresponds to a central area of the fourth support member 137d. The fourth support member 137d may be formed of a metallic material or a non-metallic material that has a specified stiffness. According to an embodiment, the fourth support member 137d may include a first metal sheet and a second metal sheet on opposite sides of the folding gap H. The first metal sheet may face the first area 101 of the display 110 and part of the folding area 103, and the second metal sheet may face the second area 102 of the display 110 and part of the folding area 103. In various embodiments, a reinforcing layer 137d (e.g., the fourth support member 137d) may be disposed on the opposite sides of the folding gap H. At least one of the third support member 137c or the fourth support member 137d may be disposed on the second support member 135 to provide a flat surface on the rear surface of the display panel 131, thereby contributing to maintaining the flatness of the display panel 131.

According to an embodiment, an insulating layer 137f may be disposed on the rear surface (e.g., the surface facing the −z-axis direction) of the first support member 137. For example, the insulating layer 137f may prevent and/or reduce unnecessary electricity from flowing between the printed circuit board on which the sensor module S1 is disposed and another component (e.g., the display panel 131). The insulating layer 137f may prevent and/or reduce interference between the display panel 131 and the sensor module S1 or at least one of electronic components disposed on the circuit boards 610 and 620.

According to an embodiment, to support a first opening (e.g., the first opening 137h) of the first support member 137 including the lattice area L under the flexible display (e.g., the display panel 131), the second support member 135 may include a second opening (e.g., a second opening 135h) that has a smaller area than the first opening.

Figure 3:
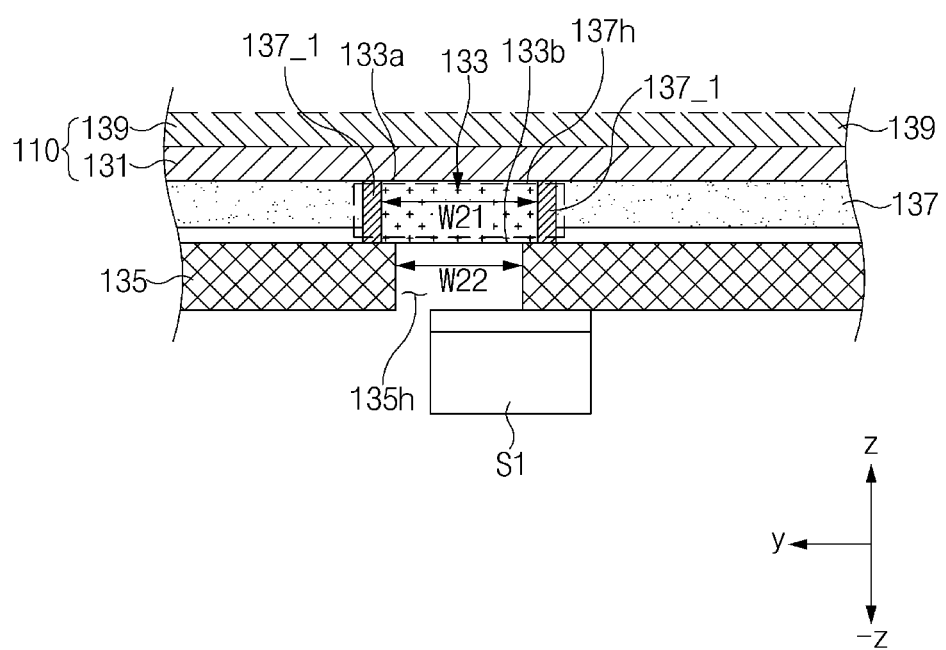
FIG. 3 is a sectional diagram illustrating an example of a partial area of a section of the electronic device according to various embodiments.

FIG. 3 is a sectional diagram illustrating an example of a partial area of the section of the electronic device according to various embodiments.

Referring to FIG. 3, a partial area of a section of the electronic device according to an embodiment (e.g., the electronic device 100 of FIG. 1D) that is taken along line A-A' may include a form as illustrated in FIG. 3. According to an embodiment, a partial area of the electronic device 100 in which the first sensor module S1 is disposed may include the display 110 (the display panel 131 and the front plate 139), the first reinforcing member 133, the second support member 135, the first support member 137, and the first sensor module S1.

According to an embodiment, the display panel 131 (e.g., part of the display 110 of FIG. 1D) may be disposed on the front surface (e.g., the surface facing the z-axis direction) of the electronic device 100. Furthermore, the first reinforcing member 133 may be disposed on a partial area of the rear surface of the display panel 131 (e.g., under the surface facing the −z-axis direction), and the first support member 137 may be disposed around the first reinforcing member 133. In this case, an external force applied to the front surface (e.g., the surface facing the z-axis direction) of the display panel 131 may be absorbed (or distributed) by the first reinforcing member 133 and the first support member 137. According to various embodiments, the display panel 131 may be a flexible display that can be repeatedly folded and unfolded.

According to an embodiment, at least portion of the first reinforcing member 133 may be disposed in the first opening 137h formed on one side of the first support member 137, and the first reinforcing member 133 may be disposed between the display panel 131 and the second support member 135. The first reinforcing member 133 may include a first surface 133a and a second surface 133b. The first surface 133a of the first reinforcing member 133 may be disposed on the rear surface of the display panel 131 (e.g., under the surface facing the −z-axis direction). In this case, the first surface 133a of the first reinforcing member 133 may be brought into close contact with the rear surface of the display panel 131. At least portion of the second surface 133b of the first reinforcing member 133 may be disposed to face the first sensor module S1 through the first opening 137h formed in the first support member 137. In this case, the second surface 133b of the first reinforcing member 133 may be disposed to face the first sensor module S1, with the second support member 135 therebetween. The first reinforcing member 133 may have a first width W21 in a direction (e.g., the y-axis direction) parallel to the display panel 131. The first reinforcing member 133 may have a size to cover at least portion of the first sensor module S. For example, the first reinforcing member 133 may have a size to cover an area of the first sensor module S1 that is capable of transmitting and receiving light in regard to sensing. The first width W21 may be an example in a case where the first sensor module S1 or the light transmitting/receiving area of the first sensor module S1 has a rectangular shape. Depending on the shape of the first sensor module S1, the size or shape of the first reinforcing member 133 may be varied. Accordingly, the first width W21 may be varied.

According to an embodiment, the first reinforcing member 133 may have a material or a structure through which a signal (e.g., light) transmitted from or received to the first sensor module S1 passes. For example, the first reinforcing member 133 may have a specified transmittance such that a signal (e.g., light) passes through the first reinforcing member 133. According to an embodiment, at least portion of the first reinforcing member 133 may be formed of a transparent material (e.g., at least one of acrylic, glass, synthetic polymer, or plastic) that has a specified transmittance and a predetermined strength (e.g., an experimentally or statistically set strength capable of resisting pressure of a specified magnitude applied to an upper portion of the first opening 137h such that the display 110 corresponding to the first opening 137h or the first sensor module S1 disposed under the display 110 is not damaged). The first reinforcing member 133 may have a structure including at least one through-hole vertically formed through the first reinforcing member 133 and may transmit and receive, through the through-hole, light of the first sensor module S1 for sensing. The transmittance, the size of the through-hole, the number of through-holes, or the like may be varied depending on the type or purpose of the first sensor module S1.

The adhesive member 137_1 may be disposed on at least a partial area around the first reinforcing member 133. According to an embodiment, the first adhesive member 137_1 may be disposed around the first reinforcing member 133 or between the first reinforcing member 133 and the first support member 137 and may prevent a movement of the first reinforcing member 133. The adhesive member 137_1 may include at least one of a liquid adhesive or a double-sided tape. At least portion of the adhesive member 137_1 may be formed of a transparent material.

According to an embodiment, the first support member 137 may be disposed between the display panel 131 and the second support member 135 in a state in which the first reinforcing member 133 is disposed inside the first support member 137. The first support member 137 may include the first opening 137h. For example, the first reinforcing member 133 may be disposed in the first opening 137h. Furthermore, the first opening 137 may have a width greater than the first width W21 of the first reinforcing member 133.

According to an embodiment, at least portion of the second support member 135 may be disposed between the first reinforcing member 133 and the first sensor module S1. The second support member 135 may include the second opening 135h. At least portion of the second opening 135h may be associated with the first opening 137h. According to various embodiments, the size of the second opening 135h may be smaller than the size of the first opening 137h. The second opening 135h may have a second width W22 in a direction (e.g., the y-axis direction) parallel to the display panel 131. The second width S22 of the second opening 135h may be smaller than the first width W21 of the first reinforcing member 133. The top side (the side facing the z-axis direction) of the second opening 135h may face the second surface 133b of the first reinforcing member 133. According to an embodiment, the center of the second opening 135h may be aligned with a portion (e.g., a central portion) of the second surface 133b of the first reinforcing member 133. An upper edge (e.g., the edge facing the z-axis direction) of the second opening 135h may be brought into contact with the second surface 133b of the first reinforcing member 133. In this case, the second support member 135 may support the first reinforcing member 133 toward the front surface (e.g., the surface facing the z-axis direction) of the electronic device 100. Furthermore, at least portion of the second support member 135 may be formed of a metallic or non-metallic material having a specified stiffness. According to an embodiment, at least portion of the second support member 135 may be a bracket assembly (e.g., 30 of FIG. 1C) or a mid plate for an arrangement of a part.

According to an embodiment, the second support member 135 may be another support member 135 that supports the first support member 137. The other support member 135 may be formed of a rigid material. The other support member 135 may include another opening 135h (e.g., the second opening 135h) that is at least partially aligned with an opening (e.g., the first opening 137h) that is formed in part of the first support member 137.

According to an embodiment, at least portion (e.g., a light transmitting part and/or a light receiving part) of the first sensor module S1 may be disposed to face the second surface 133b of the first reinforcing member 133 through the second opening 135h of the second support member 135. For example, the first sensor module S1 may be disposed to face toward the lower surface 133b of the first reinforcing member 133, with the second opening 135h therebetween. The first sensor module S1 may be, for example, a sensor module (e.g., an illuminance sensor, a proximity sensor, or a sensing module) that is capable of receiving (or, transmitting and receiving) a signal (e.g., light or LED light) or light (e.g., natural light).

According to an embodiment, the second support member 135 may be a bracket assembly (e.g., 30 of FIG. 1C) for an arrangement of a part among specific structures of the electronic device 100, the transparent member 133 (e.g., the first reinforcing member 133) may be fixed to the first support member 137 through the adhesive member 137_1, and the first support member 137 and the bracket assembly (e.g., 30 of FIG. 1C) may be fixed through an adhesive member (not illustrated). As the first support member 137 and the bracket assembly are fixed through the adhesive member (not illustrated), performance to reduce shocks applied to the display and various sensors by an external force may be maintained through the transparent member 133 (e.g., the first reinforcing member 133) even though there is a movement in relation to a leftward/rightward movement of the flexible display caused by a folding operation. Furthermore, the electronic device may be implemented such that the sensor module moves a specified distance depending on a folding operation when the flexible display moves leftward/rightward depending on the folding operation. Accordingly, the electronic device may maintain specified sensing performance.

According to an embodiment, the electronic device may further include an elastic member (not illustrated) (e.g., a sponge) between the first support member 137 and the bracket assembly (e.g., 30 of FIG. 1C).

According to an embodiment, the front plate 139 may cover the front surface (e.g., the surface facing the z-axis direction) of the display panel 131. For example, the front plate 139 may be a polyimide (PI) film or ultrathin glass capable of resisting tensile force depending on a folded state (or, a flat state) of the display panel 131.

Figure 4A:
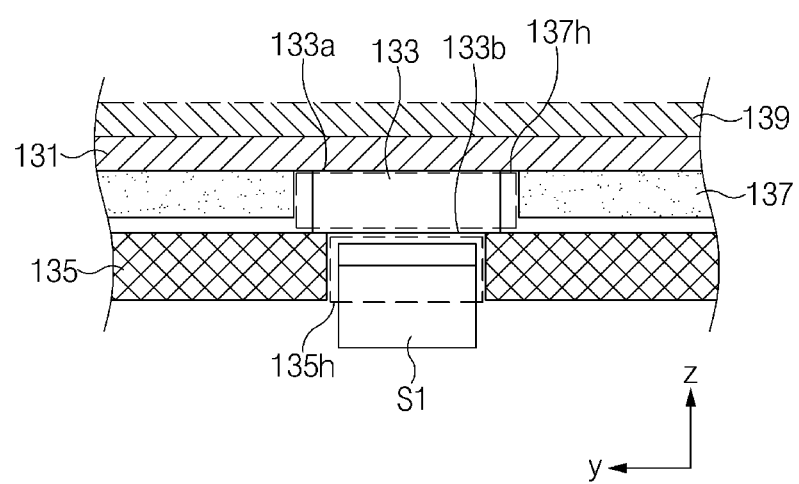
FIG. 4A is a sectional diagram illustrating a partial area of a section of an electronic device according to various embodiments.

FIG. 4A is a sectional diagram illustrating a partial area of a section of an electronic device according to various embodiments.

Referring to FIG. 4A, a partial area of a section of the electronic device according to an embodiment (e.g., the electronic device 100 of FIG. 1D) that is taken along line A-A' may include a form as illustrated in FIG. 4A. At least one of components of the electronic device 100 illustrated in FIG. 4A may be the same as, or similar to, at least one of the components of the electronic device 100 illustrated in FIG. 3, and repetitive descriptions may not be repeated here. According to an embodiment, the electronic device 100 may include the display panel 131, the first reinforcing member 133, the second support member 135, the first support member 137, the first sensor module S1, and the front plate 139.

According to an embodiment, the display panel 131 (e.g., the display panel 131 of FIG. 3) may be disposed on the front surface (e.g., the surface facing the z-axis direction) of the electronic device 100. Furthermore, the first reinforcing member 133 may be disposed on a partial area of the rear surface of the display panel 131 (e.g., under the surface facing the −z-axis direction), and the first support member 137 may be disposed around the first reinforcing member 133.

According to an embodiment, at least portion of the first support member 137 may be disposed under the display panel 131. The first support member 137 under the display panel 131 may serve to support the display panel 131. The first support member 137 may include at least one first opening 137h. According to an embodiment, at least portion of the first opening 137h may be formed in part of the first support member 137 that corresponds to the area where the first sensor module S1 is disposed. At least portion of the first reinforcing member 133 may be disposed in the first opening 137h. According to various embodiments, as mentioned above, an adhesive member may be additionally disposed between the first reinforcing member 133 disposed in the first opening 137h and the first support member 137 having the first opening 137h formed therein.

According to an embodiment, at least portion of the first reinforcing member 133 (e.g., the first reinforcing member 133 of FIG. 3) may be disposed in the first opening 137h formed on one side of the first support member 137, and the first reinforcing member 133 may be disposed between the display panel 131 and the second support member 135. At least portion of the first reinforcing member 133 may include the first surface 133a and the second surface 133b. The first surface 133a of the first reinforcing member 133 may be disposed to face the rear surface (e.g., the surface facing the −z-axis direction) of the display panel 131. At least portion of the second surface 133b of the first reinforcing member 133 may be disposed to face the first sensor module S1 through the second opening 135h formed in the second support member 135. In this case, the second surface 133b of the first reinforcing member 133 may be disposed to face the first sensor module S1 disposed in the second opening 135h of the second support member 135 (e.g., the second opening 135h of FIG. 3).

According to an embodiment, the second support member 135 may be disposed under the first reinforcing member 133 and the first support member 137. The second support member 135 may include at least one second opening 135h in relation to sensor operation. For example, the second opening 135h may be formed in part of the second support member 135 that corresponds to the area where the second surface 133b of the first reinforcing member 133 is disposed. Furthermore, at least portion (e.g., the light transmitting part and/or the light receiving part) of the first sensor module S1 may be disposed in the second opening 135h. According to an embodiment, a front surface (e.g., the surface facing the z-axis direction) of the first sensor module S1 may be disposed in the second opening 135h.

According to an embodiment, at least portion (e.g., the light transmitting part and/or the light receiving part) of the first sensor module S1 may be disposed in the second opening 135h of the second support member 135, and the first sensor module S1 may transmit and receive signals required for a sensing operation through the second opening 135h, the first opening 137h, the first reinforcing member 133, at least portion of the display panel 131, and the front plate 139.

Figure 4B:
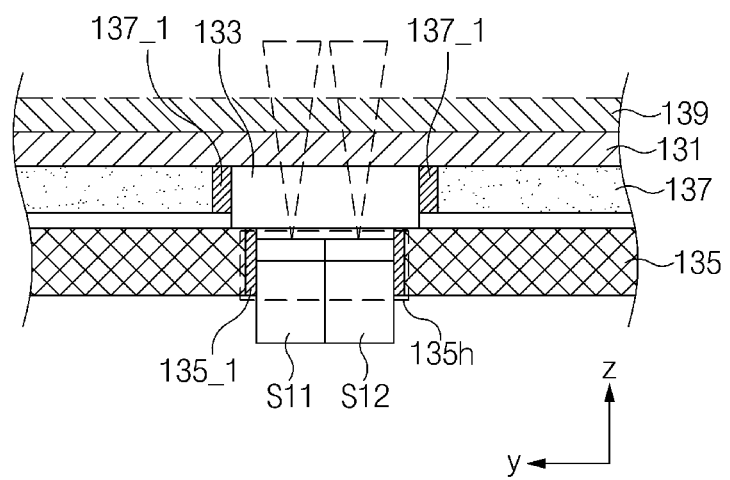
FIG. 4B is a sectional diagram illustrating another example of the partial area of a section of the electronic device according to various embodiments.

FIG. 4B is a sectional diagram illustrating another example of the partial area of the section of the electronic device according to various embodiments.

Referring to FIG. 4B, the electronic device according to various embodiments (e.g., the electronic device 100 of FIG. 1D) may include the front plate 139, the display panel 131, the first reinforcing member 133, the second support member 135, the first support member 137, and sensor modules S11 and S12.

According to an embodiment, the front plate 139 may be disposed on an upper surface (e.g., the surface facing the z-axis direction) of the display panel 131. At least portion of the front plate 139 may be bent. For example, at least portion of the front plate 139 may contain a polymer or a flexible glass material.

According to an embodiment, the display panel 131 (e.g., the display panel 131 of FIG. 3) may be disposed on the front surface (e.g., the surface facing the z-axis direction) of the electronic device 100. The display panel 131 may be disposed under the front plate 139. The first support member 137 may be disposed on the rear surface of the display panel 131 (e.g., under the surface facing the −z-axis direction) and may include the first opening 137h in which at least portion of the first reinforcing member 133 is disposed.

The first reinforcing member 133 having a predetermined size may be disposed in the first opening 137h, and the second support member 135 may be disposed under the first reinforcing member 133 and the first support member 137. At least portion of the first reinforcing member 133 may be transparent, may have a specified transparency, or may include at least one through-hole. The first reinforcing member 133 may have a structure by which at least portion of light transmitted and received by sensors S11 and S12 travels toward the display panel 131 or travels toward the sensors S11 and S12.

The second support member 135 may include the second opening 135h (e.g., the second opening 135h of FIG. 4A) in which the sensors S11 and S12 are mounted. At least portions of the sensors S11 and S12 may be mounted in the second opening 135h of the second support member 135. An adhesive member 135_1 may be disposed in a space between the second support member 135 and the sensors S11 and S12.

The sensors S11 and S12 may be integrated with each other. For example, the sensors S11 and S12 may include at least two of a proximity sensor, an illuminance sensor, an iris sensor, or a fingerprint sensor. The sensors S11 and S12 may be implemented in a form in which each sensor module includes one housing, or may have a structure that shares at least portion of a semiconductor component included in a sensor module. Although FIG. 4B illustrates a configuration in which two sensors are disposed, the technology disclosed herein is not limited thereto. In a case where the sensors S11 and S12 are formed to be larger than the structure of the first sensor module S1 described above with reference to FIG. 4A, the first opening 137h illustrated in FIG. 4B may be formed to be larger than the first opening 137h described above with reference to FIG. 4A. The second opening 135h illustrated in FIG. 4B may be formed to be larger than the second opening 135h described above with reference to FIG. 4A.

Figure 5:
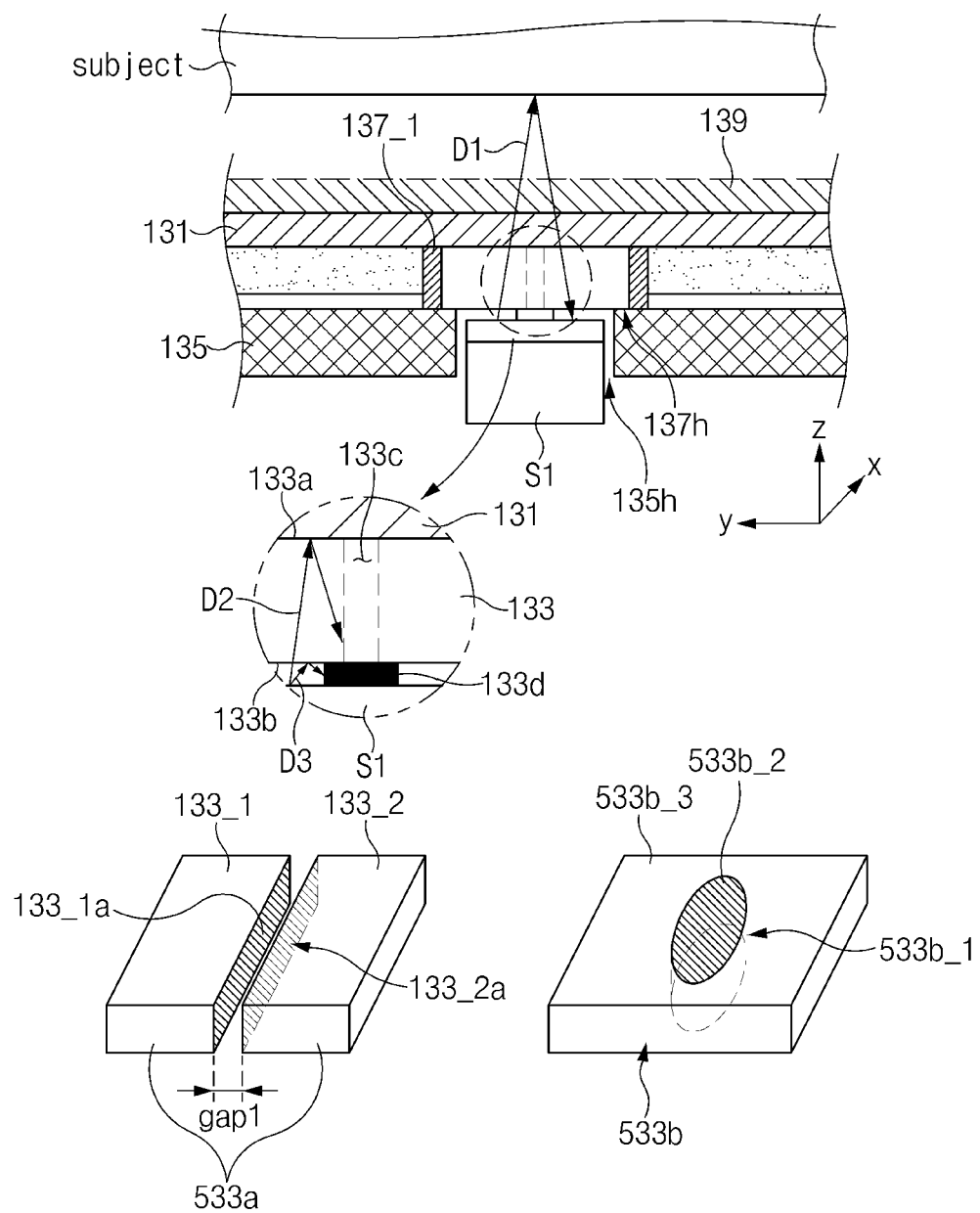
FIG. 5 is a diagram illustrating a section of an electronic device according to various embodiments.

FIG. 5 is a diagram illustrating a section of an electronic device according to various embodiments.

Referring to FIG. 5, a partial area of a section of the electronic device according to various embodiments (e.g., the electronic device 100 of FIG. 1D) that is taken along line A-A' may include a form as illustrated in FIG. 5. At least one of components of the electronic device 100 illustrated in FIG. 5 may be the same as, or similar to, at least one of the components of the electronic device 100 illustrated in FIG. 3, and repetitive descriptions may not be repeated here. According to various embodiments, the electronic device 100 may include the front plate 139, the display panel 131, the first reinforcing member 133, the second support member 135, the first support member 137, and the first sensor module S1.

According to an embodiment, the front plate 139 may be disposed on the upper surface (e.g., the surface facing the z-axis direction) of the display panel 131, and the display panel 131 may be disposed under the front plate 139. The first support member 137 may be disposed under the display panel 131, and the second support member 135 may be disposed under the first support member 137.

The first opening 137h may be formed in at least a partial area (e.g., the area where the first sensor module S1 is disposed) of the first support member 137. The second opening 135h may be formed in at least a partial area (e.g., the area where the first sensor module S1 is disposed) of the second support member 135. The first opening 137h and at least portion of the second opening 135h may be associated with each other. The first opening 137h and at least portion of the second opening 135h may overlap each other in the up-down direction (e.g., the z-axis direction).

The first reinforcing member 133 may be disposed in at least portion of the first opening 137h. The height (e.g., the height in the z-axis direction) of the first reinforcing member 133 may be greater than or equal to the height of the first support member 137. The adhesive member 137_1 may be disposed between the first reinforcing member 133 (e.g., the transparent member 133) and the first support member 137. In a case where at least portion of a horizontal section of the first reinforcing member 133 is formed in a polygonal or oval shape, the adhesive member 137_1 may be disposed in a strap shape to fill a portion around the first reinforcing member 133 (e.g., a gap between the first reinforcing member 133 and the first support member 137). The first sensor module S1 may be disposed in at least portion of the second opening 135h.

According to an embodiment, the transparent member 133 (e.g., the first reinforcing member 133) may be fixed to the first support member 137 through the adhesive member 137_1, and the first support member 137 and the foldable display (e.g., the display panel 131) may be fixed through an adhesive member (not illustrated). As the first support member 137 and the foldable display are fixed through the adhesive member (not illustrated), performance to reduce shocks applied to the display and various sensors by an external force may be maintained through the transparent member 133 (e.g., the first reinforcing member 133) even though there is a movement in relation to a leftward/rightward movement of the flexible display caused by a folding operation.

According to an embodiment, the first reinforcing member 133 (e.g., the first reinforcing member 133 of FIG. 2) may transmit (or, deliver) at least portion of a signal of the first sensor module S1 through the first surface 133a and the second surface 133b. Referring to a first path D1, the first reinforcing member 133 may deliver, toward the display panel 131, at least portion of a signal directed in the direction (e.g., the z-axis direction) toward the front surface of the electronic device 100 from the first sensor module S. In a case where at least portion of a signal transmitted toward a subject located on the front plate 139 is reflected by the subject, the first reinforcing member 133 may deliver the reflected signal to the first sensor module S. The first reinforcing member 133 may have a transmittance or transparency sufficient to transmit the signal of the first sensor module S1. The first reinforcing member 133 may include at least one through-hole for delivering the signal of the first sensor module S1.

According to an embodiment, in a case where a signal of the first sensor module S1 is reflected between the first surface 133a and the second surface 133b or is reflected by the second surface 133b and the surface of the first sensor module S1, the first reinforcing member 133 (e.g., the first reinforcing member 133 of FIG. 3) may damp (e.g., absorb) the reflected signal. The first reinforcing member 133 may include at least one of an anti-noise layer 133c and/or an anti-noise member 133d.

According to an embodiment, the anti-noise member 133d may be a light blocking member 133d located on one surface of the transparent member 133 (e.g., the first reinforcing member 133) that faces toward the sensing module S1 (e.g., the first sensor module S1), and the sensing module S1 may include a light emitting element (e.g., an LED). According to an embodiment, the anti-noise layer 133c may prevent and/or reduce occurrence of crosstalk by absorbing a signal of the first sensor module S1 that is reflected between the first surface 133a and the second surface 133b. Referring to a second path D2, the anti-noise layer 133c may absorb a signal (crosstalk) of the first sensor module S1 that is directed toward the second surface 133b after reflected by the first surface 133a. In this case, the anti-noise layer 133c may reduce an error of a signal sensed by the first sensor module S1. The anti-noise layer 133c may be formed between the first surface 133a and the second surface 133b. For example, the anti-noise layer 133c may include a first anti-noise structure 533a including a cut section that divides the first reinforcing member 133 in any one direction (e.g., the y-axis direction). The first anti-noise structure 533a may include a first prevention structure 133_1 and a second prevention structure 133_2 spaced apart from each other by a specified gap gap1. The first prevention structure 133_1 may include an upper surface, a lower surface, and side surfaces disposed between the upper surface and the lower surface. Among the side surfaces of the first prevention structure 133_1, a side surface 133_1a facing the second prevention structure 1332 may be chemically treated (e.g., painted) with specified paint. The painted side surface 133_1a may prevent and/or reduce a signal scattered inside the first prevention structure 133_1 or a crosstalk signal from being moved to the second prevention structure 133_2. The second prevention structure 133_2 may have a structure similar to that of the first prevention structure 133_1. For example, the second prevention structure 133_2 may have a polygonal panel shape, and a surface 133_2a facing the first prevention structure 133_1 may be painted with specified paint.

According to various embodiments, the anti-noise layer 133c may include a second anti-noise structure 533b in which one area of the first reinforcing member 133 is provided in a different form from a surrounding area. The second anti-noise structure 533b may include an upper surface and a lower surface that have a larger size than an upper opening area of the second opening 135h. The second anti-noise structure 533b may include a body 533b_3 including side surfaces disposed between the upper surface and the lower surface, a hole 533b_1 formed in a central portion of the body 533b_3 through the upper surface and the lower surface, and an anti-noise structure 533b_2 that fills the hole 533b_1. The hole 533b_1 may be formed in an oval shape. For example, the hole 533b_1 may be formed in an oval shape that is longer in the x-axis direction than the y-axis direction. The anti-noise structure 533b_2 may be formed to fill the hole 533b_1. The shape of the hole 533b_1 and the shape of the anti-noise structure 533b_2 are not limited to the oval shape described above and may include various shapes (e.g., a rod shape that is longer in the x-axis direction than the y-axis direction). According to various embodiments, the first anti-noise structure 533a and the second anti-noise structure 533b may further include at least one painted side surface. The first anti-noise structure 533a and the second anti-noise structure 533b described above may absorb or reduce a signal (e.g., the crosstalk signal) that is scattered inside the first reinforcing member 133 among signals emitted from the first sensor module S1.

According to an embodiment, the anti-noise member 133d may absorb a signal reflected between the second surface 133b and the first sensor module S1. Referring to a third path D3, the anti-noise member 133d may absorb a signal of the first sensor module S1 that is directed toward a surface of the first sensor module S1 after reflected by the second surface 133b. In this case, the anti-noise member 133d may contribute to a reduction in an error of a signal sensed by the first sensor module S1. The anti-noise member 133d may be disposed between the first reinforcing member 133 and the first sensor module S1. For example, the anti-noise member 133d may be formed of a sponge material.

Figure 6:
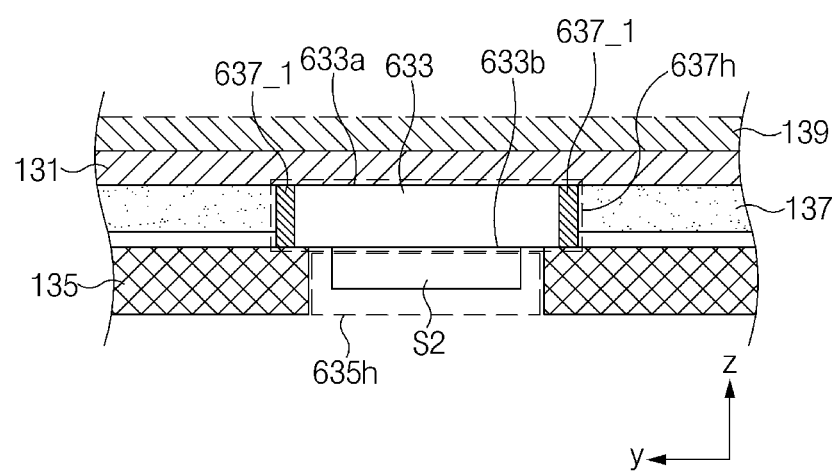
FIG. 6 is a sectional diagram illustrating a section of an electronic device according to various embodiments.

FIG. 6 is a sectional diagram illustrating a section of an electronic device according to various embodiments.

Referring to FIG. 6, the electronic device according to various embodiments (e.g., the electronic device 100 of FIG. 1D) may include at least portion of a section taken along line B-B'. At least one of components of the electronic device 100 illustrated in FIG. 6 may be the same as, or similar to, at least one of the components of the electronic device 100 illustrated in FIG. 3, and repetitive descriptions may not be repeated here. According to various embodiments, the electronic device 100 may include the front plate 139, the display panel 131, a second reinforcing member 633, the second support member 135, the first support member 137, and the second sensor module S2.

According to an embodiment, the display panel 131 (e.g., the display panel 131 of FIG. 3) may be disposed on the front surface (e.g., the surface facing the z-axis direction) of the electronic device 100. Furthermore, the second reinforcing member 633 may be disposed on a partial area of the rear surface of the display panel 131 (e.g., under the surface facing the −z-axis direction), and the first support member 137 may be disposed around the partial area.

The first support member 137 may be disposed on the rear surface of the display panel 131. The first support member 137 may include a third opening 637h formed in a position corresponding to the area where the second sensor module S2 is disposed. The third opening 637h may expose part of the rear surface of the display panel 131. At least portion of the second reinforcing member 633 may be disposed in the third opening 637h. An adhesive member 637_1 may be disposed between the second reinforcing member 633 and the first support member 137 in the state in which the second reinforcing member 633 is disposed in the third opening 637h. At least portion of the second reinforcing member 633 may be fixed in the third opening 637h of the first support member 137, based on the adhesive member 637_1.

According to an embodiment, at least portion of the second reinforcing member 633 may be disposed in the third opening 637h of the first support member 137, and the second reinforcing member 633 may be disposed between the display panel 131 and the second support member 135. The second reinforcing member 633 may have a larger size than a fourth opening 635h formed in the second support member 135. The second reinforcing member 633 may have a larger size than an upper surface (e.g., the surface facing the z-axis direction) of the second sensor module S2. The second reinforcing member 633 may include a first surface 633a and a second surface 633b. The first surface 633a of the second reinforcing member 633 may be disposed to face toward the rear surface (e.g., the surface facing the −z-axis direction) of the display panel 131. The second surface 633b of the second reinforcing member 633 may be disposed to face the second sensor module S2 through the fourth opening 635h of the second support member 135.

According to an embodiment, the second support member 135 may be disposed under the first support member 137. The fourth opening 635h may be formed in an area of the second support member 135 that corresponds to the area where the second sensor module S2 is disposed. The fourth opening 635h may be formed to be larger than at least the second sensor module S2. At least portion of the fourth opening 635h may be associated with the third opening 637h. According to various embodiments, the center of the third opening 637h and the center of the fourth opening 635h may be aligned with each other in the up-down direction (e.g., the z-axis direction). The second sensor module S2 may be disposed in the fourth opening 635h. According to various embodiments, an adhesive member may be disposed between a side surface of the second sensor module S2 and the second support member 135 and may fix the second sensor module S2. According to various embodiments, an adhesive member (e.g., a transparent adhesive member) may be disposed between the upper surface (e.g., the surface facing the z-axis direction) of the second sensor module S2 and the second surface 633b of the second reinforcing member 633 and may fix the second sensor module S2. According to various embodiments, an adhesive member may be disposed on at least one of the second surface 633b of the second reinforcing member 633, the upper surface of the second sensor module S2, an inner wall of the second support member 135 that forms the fourth opening 635h, and the side surface of the second sensor module S2.

According to an embodiment, the second sensor module S2 may be disposed to face the second surface 633b of the second reinforcing member 633 through the third opening 637h of the second support member 135. For example, the second sensor module S2 may be brought into close contact with the second surface 633b of the second reinforcing member 633 in a state of being disposed in the fourth opening 635h. The second sensor module S2 may be, for example, a sensor module (e.g., a fingerprint recognition sensor) capable of obtaining image information (e.g., image information of a fingerprint).

Figure 7A:
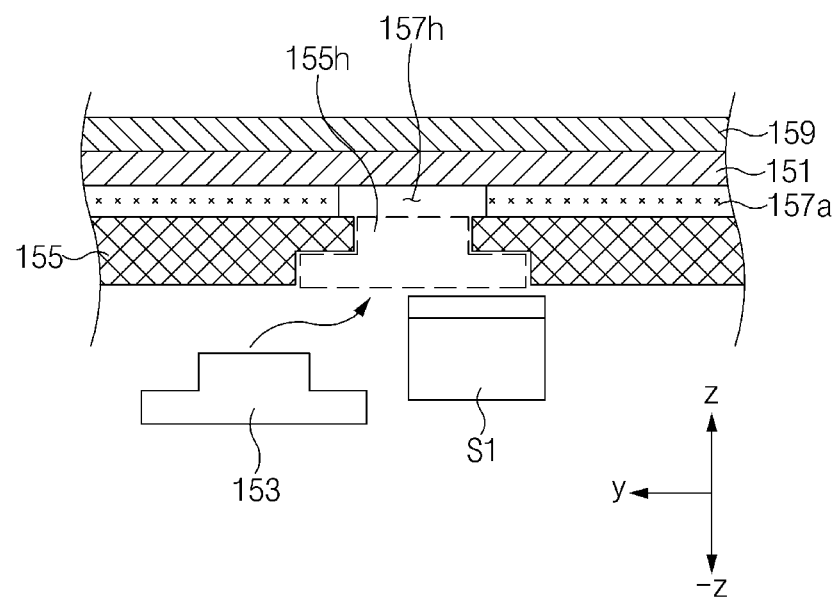
FIG. 7A is a sectional diagram illustrating a section of an electronic device according to various embodiments.
Figure 7B:
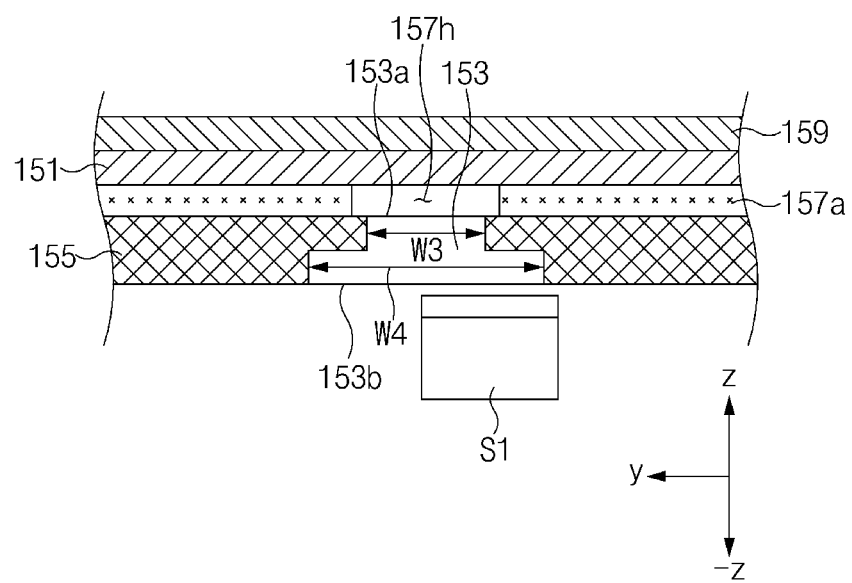
FIG. 7B is a sectional diagram illustrating a state after a coupling of a reinforcing member in the electronic device according to various embodiments.

FIG. 7A is a sectional diagram illustrating a state before a coupling of a reinforcing member in an electronic device according to various embodiments, and FIG. 7B is a sectional diagram illustrating a state after the coupling of the reinforcing member in the electronic device according to various embodiments.

At least one of components of the electronic device 100 illustrated in FIGS. 7A and 7B may be the same as, or similar to, at least one of the components of the electronic device 100 illustrated in FIG. 3, and repetitive descriptions may not be repeated here.

Referring to FIGS. 7A and 7B, the electronic device according to various embodiments (e.g., the electronic device 100 of FIG. 1D) may include a front plate 159, a display panel 151, a fifth support member 157a, a third reinforcing member 153, a sixth support member 155, and the first sensor module S1.

According to an embodiment, the front plate 159 may be disposed on an upper surface (e.g., the surface facing the z-axis direction) of the display panel 151. The fifth support member 157a may be disposed under the display panel 151. The fifth support member 157a may include, for example, at least one of a base layer or a cushion layer. At least one adhesive member may be disposed on the top side of the base layer, between the base layer and the cushion layer, and/or on the bottom side of the cushion layer. The fifth support member 157a may have a fifth opening 157h formed therein. The fifth opening 157h, for example, may be formed by removing at least one of the base layer or the cushion layer included in the fifth support member 157a. The fifth opening 157h may be formed in an area of the fifth support member 157a that corresponds to the area where the first sensor module S1 is disposed.

The sixth support member 155 may be disposed under the fifth support member 157a. At least a portion of the sixth support member 155 may be formed of a metallic material, and the remaining portion may be formed of a non-metallic material. The sixth support member 155 may include, for example, a bracket of the electronic device 100. A sixth opening 155h may be formed in an area of the sixth support member 155 that corresponds to the area where the first sensor module S1 is disposed. At least portion of the sixth opening 155h may be associated with at least portion of the fifth opening 157h. The third reinforcing member 153 may be disposed in the sixth opening 155h. The sixth opening 155h may have a stepped shape. For example, the sixth opening 155h may have a form in which a hole having a third width W3 is continuous with a hole having a fourth width W4. An adhesive member may be additionally disposed between an inner wall of the sixth support member 155 that forms the sixth opening 155h and the third reinforcing member 153.

According to an embodiment, the third reinforcing member 153 may be disposed in the sixth opening 155h formed in the sixth support member 155. At least portion of the third reinforcing member 153 may be formed of a transparent material. Alternatively, at least portion of the third reinforcing member 153 may have a specified transparency. In another case, the third reinforcing member 153 may include at least one through-hole through which signals transmitted and received by the first sensor module S1 travel. The third reinforcing member 153 may include a first surface 153a and a second surface 153b. The first surface 153a of the third reinforcing member 153 may be disposed to face one side (e.g., the side facing the −z-axis direction) of the fifth opening 157h of the fifth support member 157a. The second surface 153b of the third reinforcing member 153 may be disposed to face the first sensor module S1. The first surface 153a and the second surface 153b of the third reinforcing member 153 may have different lengths in a direction (e.g., the y-axis direction) parallel to the display panel 151. Alternatively, the first surface 153a and the second surface 153b may have the same thickness, or may have different thicknesses. For example, the first surface 153a of the third reinforcing member 153 may have the third width W3 in the direction (e.g., the y-axis direction) parallel to the display panel 151. Furthermore, the second surface 153b of the third reinforcing member 153 may have the fourth width W4 in the direction (e.g., the y-axis direction) parallel to the display panel 151. The fourth width W4 may be greater than the third width W3. The third width W3 may be smaller than the size of the fifth opening 157h.

According to an embodiment, at least portion (e.g., the light transmitting part and/or the light receiving part) of the first sensor module S1 may be disposed to face the second surface 153b of the third reinforcing member 153. The first sensor module S1 may emit a specified signal upward through the second surface 153b of the third reinforcing member 153, the first surface 153a, the fifth opening 157h, and the rear surface of the display panel 151, or may collect a signal delivered through the front plate 159, the rear surface of the display panel 151, the fifth opening 157h, the first surface 153a, and the second surface 153b.

Figure 8:
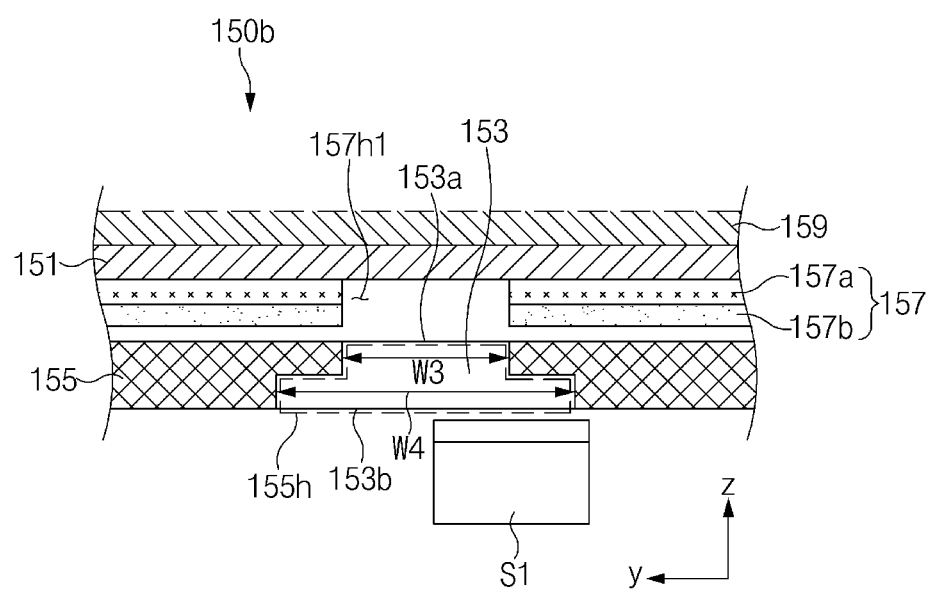
FIG. 8 is a sectional diagram illustrating a section of an electronic device according to various embodiments.

FIG. 8 is a sectional diagram illustrating at least portion of a section of an electronic device according to various embodiments.

Referring to FIG. 8, the electronic device 100 may include the front plate 159, the display panel 151, the third reinforcing member 153, a seventh support member 157, the sixth support member 155, and the first sensor module S1.

According to an embodiment, the display panel 151 may be disposed under the front plate 159, and the seventh support member 157 may be disposed under the display panel 151. The seventh support member 157 may include the fifth support member 157a described above with reference to FIGS. 7A and 7B and a support member 157b, at least portion of which is implemented with a metal layer. The support member 157b may include, for example, at least one of the third support member 137c or the fourth support member 137d described above with reference to FIG. 2. At least one adhesive layer or adhesive member may be disposed between one or more layers (e.g., the base layer 137a, the cushion layer 137b, the third support member 137c, and the fourth support member 137d) that comprise the seventh support member 157. The seventh support member 157 may have a seventh opening 157hl formed on one side thereof. The seventh opening 157hl may expose part of the rear surface of the display panel 151. The seventh opening 157hl may be formed in at least a partial area of the seventh support member 157 that corresponds to the area where the first sensor module S1 is disposed.

According to an embodiment, the sixth support member 155 may be disposed under the seventh support member 157. The sixth support member 155 may have the sixth opening 155h formed on one side thereof. The sixth opening 155h, for example, may be disposed to correspond to the widths W3 and W4 of the first surface 153a and the second surface 153b. In this case, the periphery of the third reinforcing member 153 may be coupled to the inside of the sixth opening 155h of the sixth support member 155. At least portion of the sixth opening 155h may be associated with the seventh opening 157hl. According to various embodiments, the center of the seventh opening 157hl and the center of the sixth opening 155h may be aligned with each other in the up-down direction (e.g., the z-axis direction).

According to an embodiment, at least portion (e.g., the light transmitting part and/or the light receiving part) of the first sensor module S1 may be disposed to face the second surface 153b of the third reinforcing member 153. An adhesive member may be additionally disposed between the third reinforcing member 153 and the sixth support member 155.

Figure 9A:
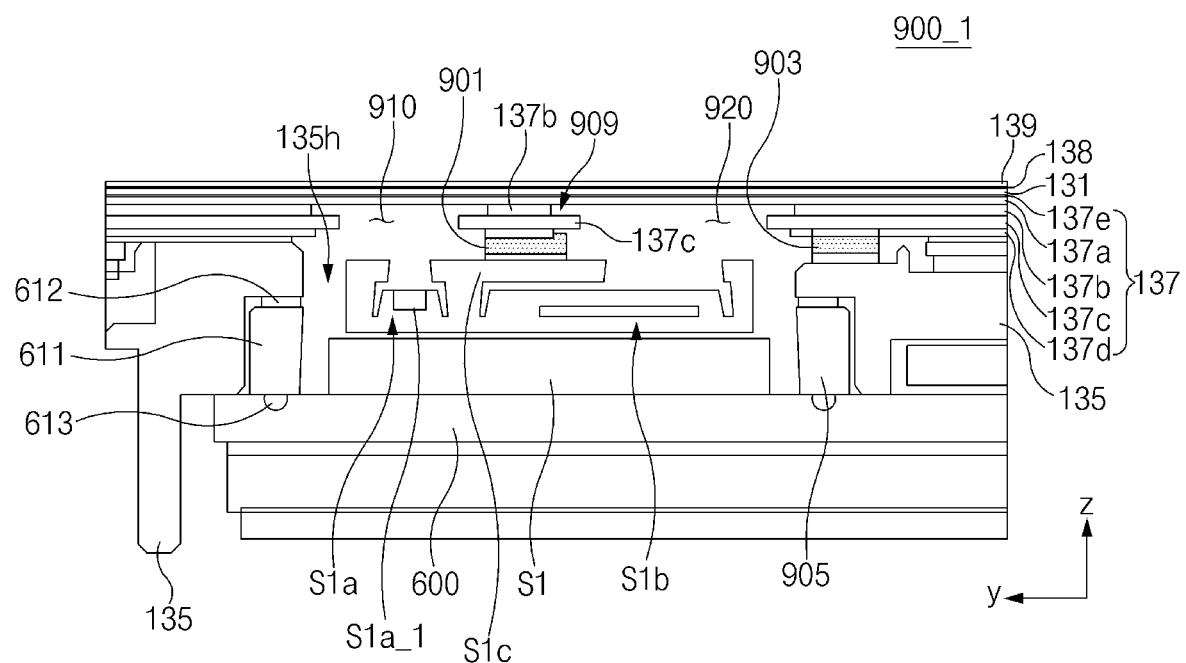
FIG. 9A is a sectional diagram illustrating an example form of a section taken along line A-A' or B-B' of FIG. 1D according to various embodiments.
Figure 9B:
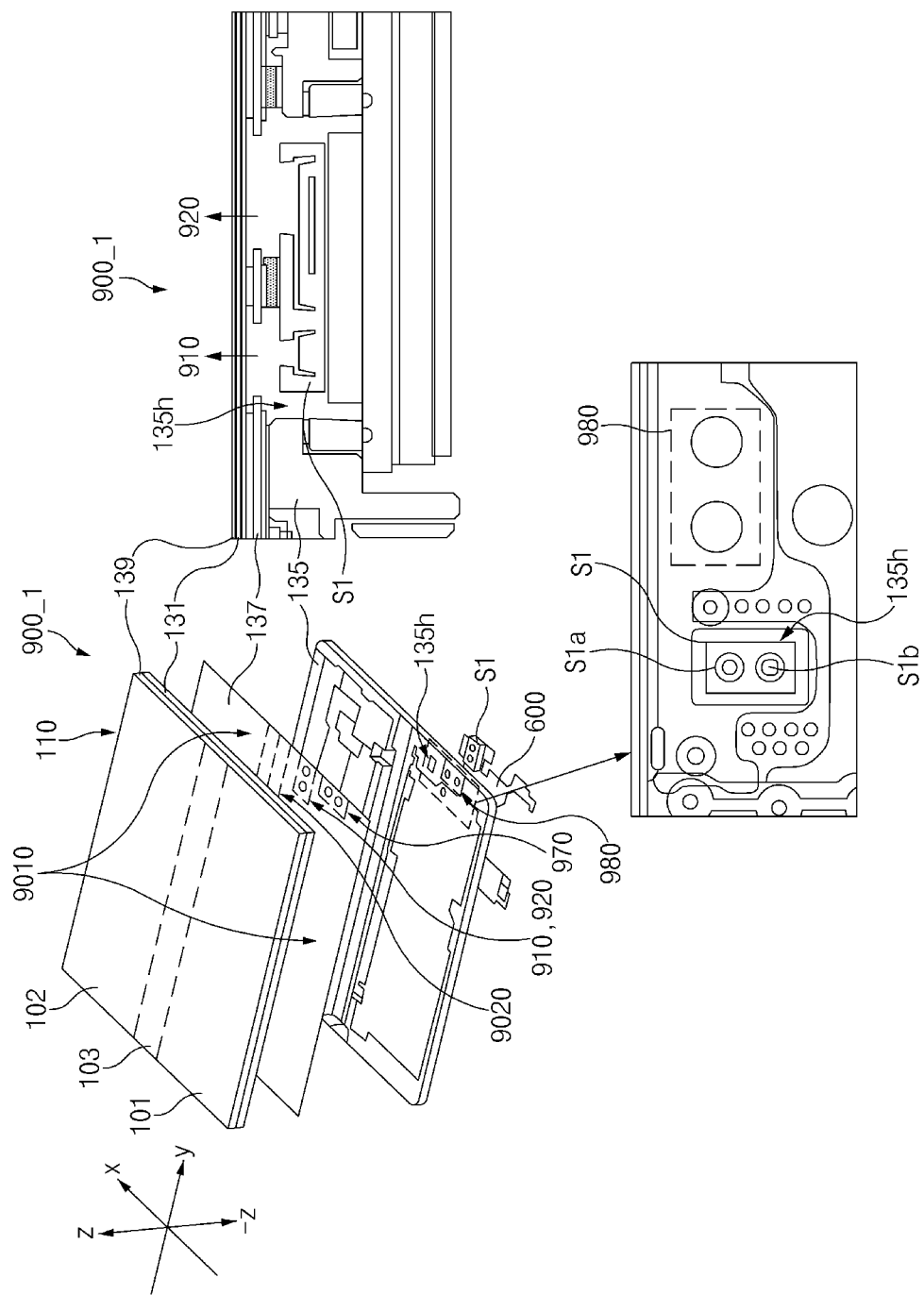
FIG. 9B is an exploded perspective view of an electronic device related to FIG. 9A according to various embodiments.

FIG. 9A is a diagram illustrating an example form of the section taken along line A-A' or B-B' of FIG. 1D according to various embodiments, and FIG. 9B is an exploded perspective view of an electronic device related to FIG. 9A according to various embodiments.

Referring to FIGS. 9A and 9B, the electronic device 9001 may include the front plate 139, the display panel 131, the first support member 137, the second support member 135, the first sensor module S1, and the circuit board 600 (or, a printed circuit board). The second opening 135h may be formed in the second support member 135 as described above, and at least portion of the first sensor module S1 may be disposed in the second opening 135h. The first support member 137 may include the adhesive layer 137e, the base layer 137a, the cushion layer 137b, the third support member 137c, and the fourth support member 137d. The first support member 137 may further include adhesive members disposed between the layers or on predetermined portions of the layers. According to various embodiments, an adhesive layer 138 may be additionally disposed between the front plate 139 and the display panel 131.

An opening where at least some layers are removed may be formed in at least a partial area of the first support member 137 that corresponds to the area where the first sensor module S1 is disposed. For example, the first support member 137 may include an eighth opening 910 formed in an area corresponding to the area of a signal transmitting part S1a (e.g., a light emitting element S1a (e.g., a structure including an LED S1a_1)) of the first sensor module S1 and a ninth opening 920 formed in an area corresponding to the area of a signal receiving part S1b. The eighth opening 910 and the ninth opening 920 may be disposed adjacent to each other and may be disposed side by side with respect to the y-axis. As part of the first support member 137 is removed by the eighth opening 910, the lower surface of the display panel 131 (or, the display panel 131) and the lower surface of the adhesive layer 137e may face the signal transmitting part S1a of the first sensor module S1. As part of the first support member 137 is removed by the ninth opening 920, the lower surface of the display panel 131 (or, the display panel 131) and the lower surface of the adhesive layer 137e may face the signal receiving part S1b of the first sensor module S1. Part (e.g., the adhesive layer 137e, the base layer 137a, the cushion layer 137b, the third support member 137c, or the fourth support member 137d) of the first support member 137 may be maintained between the eighth opening 910 and the ninth opening 920. A partial area 909 of the first support member 137 disposed between the eighth opening 910 and the ninth opening 920 may be brought into contact with the first sensor module S1, or may be brought into contact with a blocking member 901 disposed on the upper surface of the first sensor module S1 (e.g., on the surface facing the z-axis direction or on one side of a housing S1c). The blocking member 901 may block crosstalk or noise between the signal transmitting part S1a and the signal receiving part S1b. According to various embodiments, the blocking member 901 may relieve at least portion of pressure transmitted through the partial area 909 of the first support member 137. According to various embodiments, the signal receiving part S1b may be a light receiving sensor S1b that receives light. The first sensor module S1 may include the housing S1c that includes a structure surrounding the signal transmitting part S1a and a structure surrounding the signal receiving part S1b.

According to various embodiments, as illustrated in FIG. 9B, the first support member 137 may include at least one first camera hole 970. According to an embodiment, at least one camera may be disposed under the second support member 135 (e.g., under the surface facing the −z-axis direction) and may take an image corresponding to an external subject through a second camera hole 980 formed in the second support member 135, the first camera hole 970, the display panel 131, and the front plate 139. In this regard, the first camera hole 970 and the second camera hole 980 may be vertically disposed in the z-axis direction. Although the structure in which each of the first camera hole 970 and the second camera hole 980 has two holes is illustrated, the disclosure is not limited thereto. For example, each of the first camera hole 970 and the second camera hole 980 may have three or more holes depending on a function that the electronic device 900_1 supports, and accordingly three or more cameras may be disposed under the second support member 135.

The display 110 may include the display panel 131 and the front plate 139. At least portion of the display 110 may be deformed into a flat surface or a curved surface. According to an embodiment, the display 110 may include the folding area 103, and the first area 101 and the second area 102 disposed on the opposite sides of the folding area 103. The first area 101 and the second area 102 may remain flat while the folding area 103 is bent by folding or flattened by unfolding.

According to various embodiments, the first support member 137 may be disposed between the display 110 (or, the flexible display) and the second support member 135 (or, the housing) and may include a first support area 9010 corresponding to the first area 101 and the second area 102 (or, the first display area) of the display 110 and having a first flexibility and a second support area 9020 corresponding to the folding area 103 (or, the first display area) of the display 110 and having a second flexibility higher than the first flexibility. At least one of the eighth opening 910 or the ninth opening 920 may be formed on one side of the first support area 9010 (e.g., in an area corresponding to the first area 101), and the second support area 9020 may be bent as the second support member 135 is folded.

According to various embodiments, the second support member 135 may include the second opening 135h corresponding to at least one of the eighth opening 910 or the ninth opening 920. The second opening 135h may have a size corresponding to the entire size of the eighth opening 910 and then in the opening 920. Alternatively, according to various embodiments, the second opening 135h may include an opening corresponding to the eighth opening 9010 and an opening corresponding to the ninth opening 920. At least portion of the first sensor module S1 may be aligned with and disposed in the second opening 135h. Alternatively, at least portion of the first sensor module S1 may be mounted in the second opening 135h. The signal transmitting part S1a disposed in the first sensor module S1 may transmit a signal through at least portion of the second opening 135h and the eighth opening 910, and the signal receiving part S1b may receive light passing through at least the ninth opening 920 and the second opening 135h. According to various embodiments, the size of the upper surface (the surface facing the z-axis direction) of the signal transmitting part S1a may be smaller than or equal to the size of the eighth opening 910. According to various embodiments, the size of the upper surface (the surface facing the z-axis direction) of the signal receiving part S1b may be smaller than or equal to the size of the ninth opening 920. The first sensor module S1 may be fixedly mounted on the printed circuit board 600. Accordingly, part of the first sensor module S1, in which the signal transmitting part S1a and the signal receiving part S1b are disposed, may be disposed to face toward the eighth opening 910 and the ninth opening 920 through the second opening 135h.

The electronic device 900_1 according to an embodiment that has the above-described structure may provide a structure in which the eighth opening 910 and the ninth opening 920 are formed by removing partial areas of the first support member 137 disposed on the rear surface of the display panel 131, the partial area 909 of the first support member 137 between the eighth opening 910 and the ninth opening 920 is maintained, the partial area 909 of the first support member 137 and the first sensor module S1 are disposed to make contact with each other, and thus even through external pressure is applied to the area where the first sensor module S1 is disposed, the partial area 909 of the first support member 137 is able to resist the corresponding pressure.

The circuit board 600 may include a sidewall 611 having the first sensor module S1 mounted on one surface thereof (e.g., the surface facing the z-axis direction) and surrounding the first sensor module S1, a cushion layer 612 (or, an adhesive layer or a sealing layer) disposed between the sidewall 611 and the second support member 135, and a fixing structure 612 (e.g., a soldering part or an adhesive part) that fixes the sidewall 611 to the circuit board 600. The sidewall 611 may be disposed to be spaced apart from the housing S1c of the first sensor module S1 at a predetermined interval.

According to various embodiments, the blocking member 901 may be disposed between the first sensor module S1 and the partial area 909 of the first support member 137, and thus the electronic device 9001 may reduce signal interference or crosstalk between the signal transmitting part S1a and the signal receiving part S1b. According to various embodiments, the electronic device 9001 may further include at least one of a blocking member 905 (or, a sponge) disposed between the second support member 135 and the circuit board 600 or a foreign matter prevention member 903 disposed between the second support member 135 and the first support member 137. An adhesive member may be additionally disposed between the blocking member 905 and the second support member 135. The blocking member 905 may block a flow of foreign matter between other areas of the electronic device 900_1, and the second opening 135h in which the first sensor module S1 is disposed, the eighth opening 910, and the ninth opening 920. The blocking member 905 may reduce or block pressure transmitted through the first support member 137.

Figure 10:
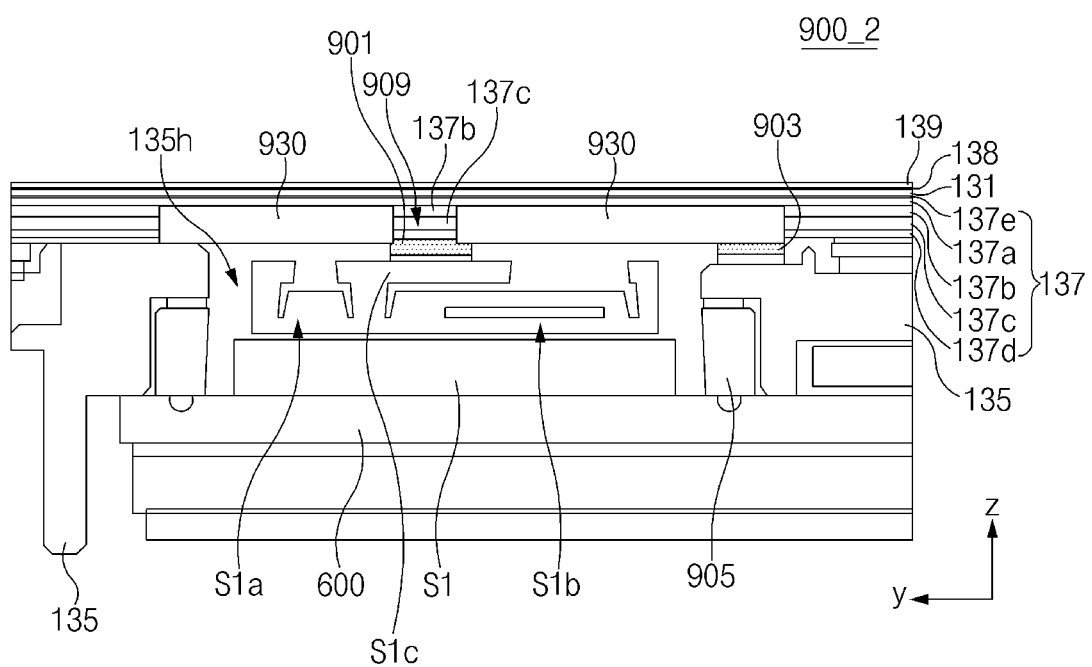
FIG. 10 is a sectional diagram illustrating an example form of the section taken along line A-A' or B-B' of FIG. 1D according to various embodiments.

FIG. 10 is a diagram illustrating an example form of the section taken along line A-A' or B-B' of FIG. 1D according to various embodiments.

Referring to FIG. 10, an electronic device 900_2 according to an embodiment may include the front plate 139, the display panel 131, the first support member 137, the second support member 135, the first sensor module S1, and the circuit board 600 (or, a printed circuit board). The second opening 135h may be formed in the second support member 135 as described above, and at least portion of the first sensor module S1 may be disposed in the second opening 135h. The first support member 137 may include the adhesive layer 137e, the base layer 137a, the cushion layer 137b, the third support member 137c, and the fourth support member 137d. The first support member 137 may further include adhesive members disposed between the layers or on predetermined portions of the layers. According to various embodiments, the adhesive layer 138 may be additionally disposed between the front plate 139 and the display panel 131.

The electronic device 900_2 having the above-described structure may further include a fourth reinforcing member 930 disposed in the eighth opening 910 and the ninth opening 920, as compared with the electronic device 900_1 described above with reference to FIG. 9A. According to various embodiments, the fourth reinforcing member 930 may be disposed in the eighth opening 910 and the ninth opening 920 described above with reference to FIGS. 9A and 9B and may include a reinforcing member facing the signal transmitting part S1a and a reinforcing member facing the signal receiving part S1b. The first sensor module S1 may include the housing S1c that includes the structure surrounding the signal transmitting part S1a and the structure surrounding the signal receiving part S1b.

According to various embodiments, the eighth opening 910 and the ninth opening 920 may be divided from each other with respect to the partial area 909 of the first support member 137 described above with reference to FIG. 9A and may form a strap shape in a donut form as a whole. In this case, at least portion of a section of the fourth reinforcing member 930 may have a strap shape, and the fourth reinforcing member 930 may be formed as one reinforcing member. As the fourth reinforcing member 930 is disposed in the eighth opening 910 and the ninth opening 920 described above with reference to FIG. 9A, one side of the fourth reinforcing member 930 may be disposed to make contact with the foreign matter prevention member 903. According to various embodiments, the fourth reinforcing member 930 may be disposed to surround the partial area 909 of the first support member 137, and at least portion of the fourth reinforcing member 930 may make contact with the second support member 135. Accordingly, even though external pressure is applied to the area where the first sensor module S1 is disposed, the corresponding pressure may be transmitted to the fourth reinforcing member 930 and the partial area 909 of the first support member 137, and at least portion of the transmitted pressure may be removed through the second support member 135. Thus, the first sensor module S1 and the display panel 131 disposed over the first sensor module S1 may be prevented from being damaged.

Figure 11A:
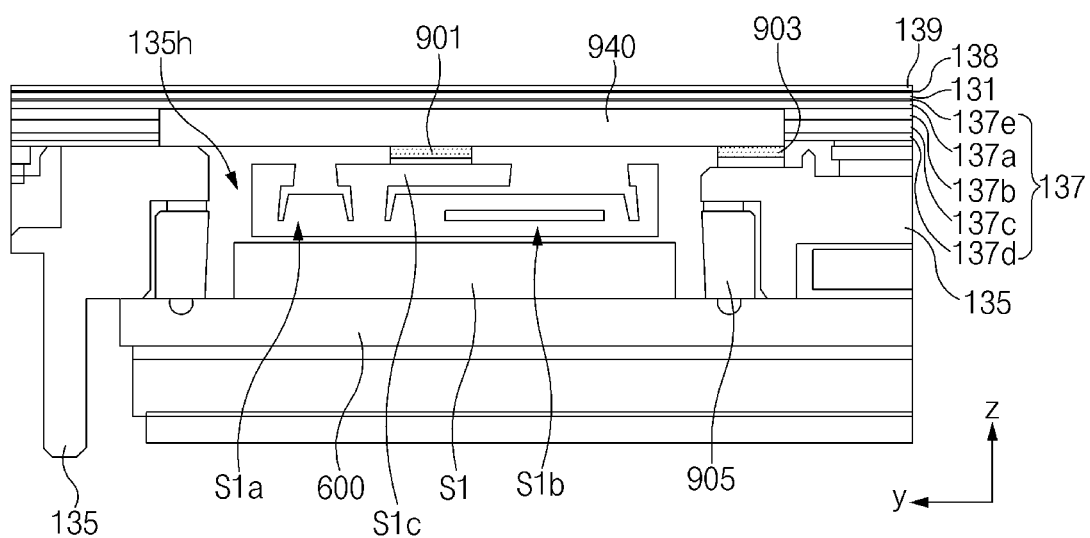
FIG. 11A is a sectional diagram illustrating an example form of the section taken along line A-A' or B-B' of FIG. 1D according to various embodiments.
Figure 11B:
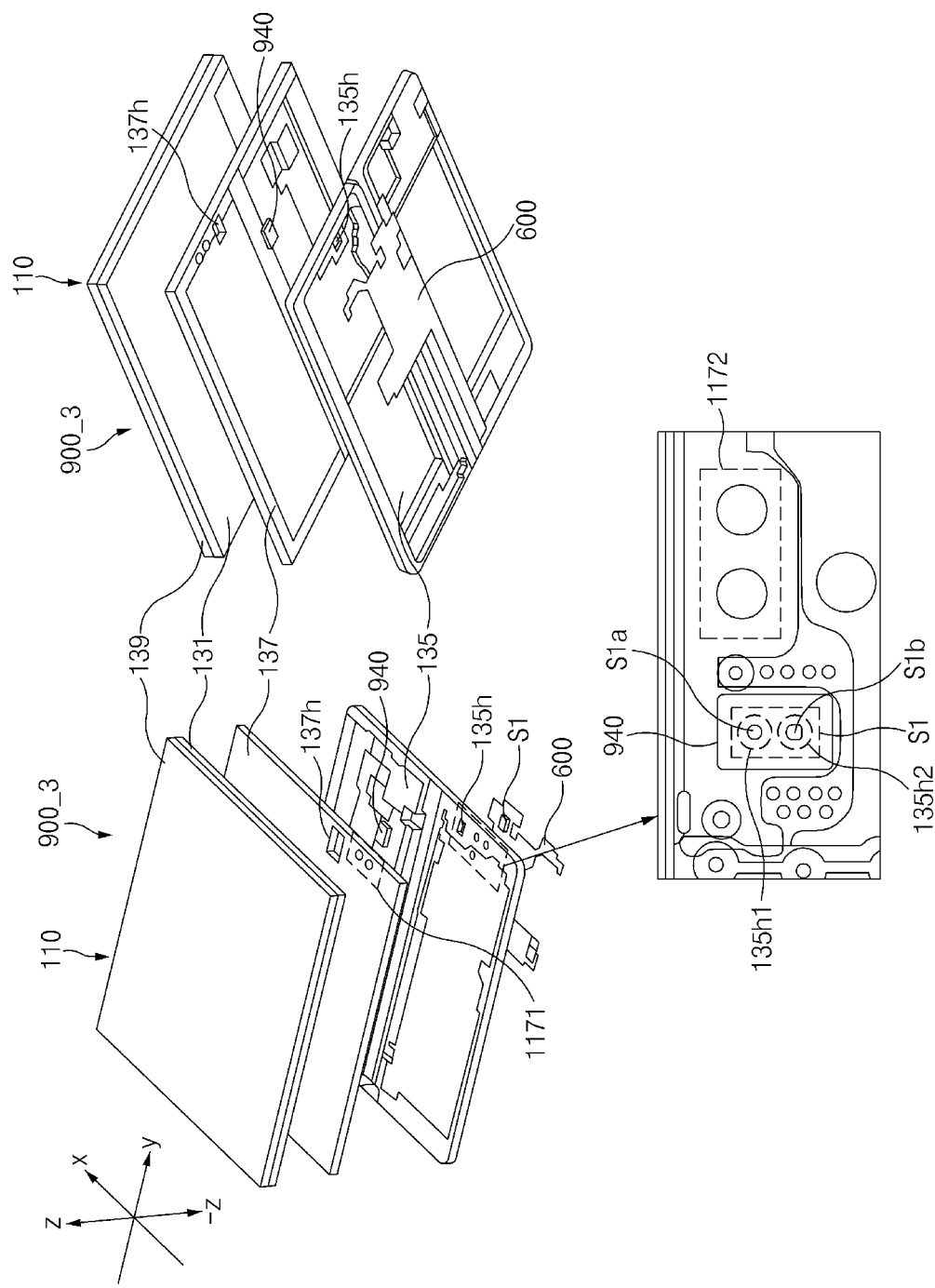
FIG. 11B is an exploded perspective view of an electronic device corresponding to FIG. 11A according to various embodiments.

FIG. 11A is a diagram illustrating an example form of the section taken along line A-A' or B-B' of FIG. 1D according to various embodiments, and FIG. 11B is an exploded perspective view of an electronic device corresponding to FIG. 11A according to various embodiments.

Referring to FIGS. 11A and 11B, the electronic device 900_3 according to an embodiment may include at least the display 110 (the front plate 139 and the display panel 131), the first support member 137, the second support member 135, the first sensor module S1, and the circuit board 600 (or, a printed circuit board). The second opening 135*h* may be formed in the second support member 135 as described above, and at least portion of the first sensor module S1 may be disposed in the second opening 135*h*. According to various embodiments, the electronic device 9003 may further include a rear circuit board or a rear panel disposed under the circuit board 600 (e.g., under the surface facing the −z-axis direction).

The display 110 may include the front plate 139 disposed on the top thereof (e.g., the surface facing the z-axis direction) and the display panel 131 disposed on the bottom thereof (e.g., the surface facing the −z-axis direction). As described above with reference to FIG. 9B, the display 110 may have the flat areas on the opposite sides of the folding area. At least portion of the first support member 137 may be disposed under the display 110 (in the −z-axis direction). According to various embodiments, the adhesive layer 138 may be additionally disposed between the front plate 139 and the display panel 131.

The first support member 137 may include the adhesive layer 137*e*, the base layer 137*a*, the cushion layer 137*b*, the third support member 137*c*, and the fourth support member 137*d*. The first support member 137 may further include adhesive members disposed between the layers or on predetermined portions of the layers. At least portion of the first support member 137 may be disposed between the bottom (the surface facing the −z-axis direction) of the display 110 and the top (the surface facing the z-axis direction) of the second support member 135. The first opening 137*h* aligned with the first sensor module S1 in the up-down direction may be formed on one side of the first support member 137. The first opening 137*h* may be formed to be larger than the upper surface (e.g., the surface facing the z-axis direction) of the first sensor module S1. According to various embodiments, the first opening 137*h* may have a size that is the same as, or similar to, the size of the signal transmitting part and the signal receiving part (such that a signal transmitted by the signal transmitting part disposed in the first sensor module S1 is emitted toward the display 110 and is delivered to the signal receiving part). In this case, the first opening 137*h* may have a size that is smaller than the size of the upper surface of the first sensor module S1 and is greater than the size of the signal transmitting part and the signal receiving part. According to various embodiments, a first camera hole 1171 related to operation of a camera of the electronic device 9003 may be disposed on one side of the first support member 137. The first camera hole 1171 may be vertically formed through the surface of the first support member 137 that faces the z-axis direction and the surface of the first support member 137 that faces the −z-axis direction.

Although two first camera holes 1171 are illustrated in FIG. 11B, the disclosure is not limited thereto, and as many first camera holes 1171 as cameras disposed in the electronic device 900_3 may be formed. One end of the display 110 may be disposed over the first camera holes 1171 (in the z-axis direction), and one side of the second support member 135 may be disposed under the first camera holes 1171 (in the −z-axis direction). The second support member 135 may include a central portion where at least one foldable hinge structure is disposed (e.g., at least one hinge structure and a hinge housing in which the hinge structure is mounted) and plates connected to the central portion.

The second support member 135 may be disposed under the first support member 137 (in the −z-axis direction). The second support member 135 may include, on one side thereof, the second opening 135*h* aligned with the first opening 137*h* in the up-down direction. The first sensor module S1 and the circuit board 600 may be disposed under the second opening 135*h* (in the −z-axis direction). Alternatively, at least portion of the first sensor module S1 disposed under the second opening 135*h* (in the −z-axis direction) may be aligned with the second opening 135*h*. According to various embodiments, at least portion of an upper portion of the first sensor module S1 may be disposed in the second opening 135*h*. Second camera holes 1172 vertically aligned with the first camera holes 1171 formed in the first support member 137 may be disposed in an area adjacent to the second opening 135*h*. As many second camera holes 1172 as the first camera holes 1171 may be provided. At least one camera may be disposed under the second camera holes 1172 (in the −z-axis direction).

According to various embodiments, the second support member 135 may include only hole areas 135*hl* and 135*h2* that correspond to the signal transmitting part S1a and the signal receiving part S1b disposed in the first sensor module S1. The size of the first hole area 135*hl* may be equal to or greater than the size of the signal transmitting part S1a. The size of the second hole area 135*h2* may be equal to or greater than the size of the signal receiving part S1b. The total size of the hole areas 135*hl* and 135*h2* may be smaller than or equal to the size of the second opening 135*h*.

According to various embodiments, in a case where the second support member 135 includes the hole areas 135*hl* and 135*h2*, a tenth reinforcing member 940 may be integrally formed with the second support member 135, and the holes areas 135*hl* and 135*h2* may be formed in the tenth reinforcing member 940. In this case, without a separate reinforcing member, a portion around the hole areas 135*hl* and 135*h2* in the area of the second support member 135 where the first sensor module S1 is disposed may replace the tenth reinforcing member 940, and the signal transmitting part S1a and the signal receiving part S1b of the first sensor module S1 may be disposed to transmit and receive signals for sensing through the hole areas 135*hl* and 135*h2*. In this process, at least a part of the signal transmitting part S1a and the signal receiving part S1b may be located in the hole areas 135*hl* and 135*h2*, and the upper surfaces (the surfaces facing the z-axis direction) of the signal transmitting part S1a and the signal receiving part S1b may be located at the same height as, or in a lower position than, the upper surface (the surface facing the z-axis direction) of the second support member 135. In a case where the tenth reinforcing member 940 is integrally formed with the second support member 135, a reinforcing area corresponding to the tenth reinforcing member 940 may be formed of the same material as that of the second support member 135 or an opaque material and may have a specified stiffness and protect the first sensor module S1 or the rear surface of the display 110.

The above-described electronic device 9003 may include a form in which the partial area 909 of the first support member 137 is removed and the reinforcing member replaces the corresponding area, as compared with the electronic device 900_2 described above with reference to FIG. 10. For example, the electronic device 9003 may have a structure in which the tenth reinforcing member 940 is disposed in the area where the first sensor module S1 is disposed under the display panel 131 (or, under the display panel 131 and the adhesive layer 138). The tenth reinforcing member 940 may be disposed in an opening formed by removing part of the first support member 137.

According to various embodiments, the blocking member 901 may be disposed on one side of the first sensor module S1. The blocking member 901 may be disposed to make contact with one side of the tenth reinforcing member 940. The foreign matter prevention member 903 may be disposed between the tenth reinforcing member 940 and the second support member 135. The foreign matter prevention member 903 may prevent infiltration of foreign matter from the outside into the space in which the first sensor module S1 is disposed. According to various embodiments, the foreign matter prevention member 903 may relieve at least portion of pressure applied to the tenth reinforcing member 940. The first sensor module S1 may include the housing Sic that includes the structure surrounding the signal transmitting part S1a and the structure surrounding the signal receiving part S1b.

According to various embodiments, the tenth reinforcing member 940 may be vertically arranged and disposed between the first opening 137h formed in the first support member 137 and the second opening 135h formed in the second support member 135. At least portion of the tenth reinforcing member 940 may be formed of a transparent material. The size of the tenth reinforcing member 940 may be the same as, or similar to, the size of the first opening 137h formed in the first support member 137. Alternatively, the tenth reinforcing member 940 may be formed to be smaller than the first opening 137h and may be located in the first opening 137h. According to various embodiments, the tenth reinforcing member 940 may be formed to be larger than the first opening 137h. Additionally or alternatively, an adhesive member may be disposed between the periphery of the tenth reinforcing member 940 and the inner wall that forms the first opening 137h and may fix the tenth reinforcing member 940 to the first opening 137h.

The size of the tenth reinforcing member 940 may be greater than the size of the second opening 135h. According to various embodiments, a step portion may be formed (engraved in the −z-axis direction) on the upper surface (the surface facing the z-axis direction) of the second support member 135 in which the second opening 135h is formed, and in a case where the tenth reinforcing member 940 is formed to be larger than the first opening 137h, the tenth reinforcing member 940 may be seated on the step portion. In this regard, the step portion may have a size that is the same as, or similar to, the size of the tenth reinforcing member 940. An adhesive member may be disposed between the step portion and the tenth reinforcing member 940 and may prevent a movement of the tenth reinforcing member 940.

According to various embodiments, at least portion of the sensing module S1 (e.g., the first sensor module S) may be accommodated in another opening 135h (e.g., the second opening 135h) such that the upper surface of the sensing module S1 is located above the lower surface of another support member 135 (e.g., the second support member 135).

According to various embodiments, an opening may include a first opening (e.g., the eighth opening 910) and a second opening (e.g., the ninth opening 920) spaced apart from the first opening (e.g., the eighth opening 910). The sensing module S1 may further include a light emitting element. The light receiving sensor S1b may be aligned with the first opening (e.g., the eighth opening 910), and the light emitting element Sla (e.g., an LED) (e.g., the signal transmitting part Sla) may be aligned with the second opening (e.g., the ninth opening 920).

According to various embodiments, a flexible display (e.g., the display panel 131) may form the exterior of an electronic device with a foldable flexible material without a rigid structure such as glass, and a transparent member (e.g., the fourth reinforcing member 930 and/or the tenth reinforcing member 940) may support an interior space (e.g., the eighth opening 910 and/or the ninth opening 920) that is deformable by an external force applied to the flexible material.

Although the structure in which one sensor includes the signal transmitting part S1a and the signal receiving part S1b has been described above with reference to FIGS. 9A, 9B, 10, 11A and 11B (which may be referred to hereinafter as FIGS. 9A to 11 for convenience), the disclosure is not limited thereto. For example, the sensor module described above with reference to FIGS. 9A to 11 may have a structure including a plurality of sensors. In this case, Sla and S1b may be different types of sensors, or may be the same type of sensors having different characteristics. For example, in a case where Sla is an illuminance sensor, Sib may be a proximity sensor. Sla may be a camera sensor, and Sib may be an iris sensor. In another case, Sla may be a fingerprint sensor, and S1b may be an illuminance sensor.

Although the foldable electronic device having the above-described sensor module structure has been described with reference to FIGS. 1A, 1B, 1C and 1D, the disclosure is not limited thereto. For example, the above-described sensor module structure may be applied to a portable electronic device of a bar type.

As described above, a portable communication device according to an example embodiment may include: a foldable housing, a flexible display accommodated in the housing and including a first display area that remains substantially flat in a state in which the housing is folded and a second display area bendable as the housing is folded, a support located between the flexible display and the housing including a first area corresponding to the first display area and having a first flexibility and a second area corresponding to the second display area and having a second flexibility greater than the first flexibility, wherein an opening is formed in the first area, and a sensing module accommodated in the housing and including a light receiving sensor at least partially aligned with the opening and configured to sense light passing through the opening.

According to various example embodiments, the portable communication device may include a transparent member comprising a transparent material attached to at least portion of an inner surface of the opening in the support.

According to various example embodiments, a light blocking member comprising a light blocking material may be located on one surface of the transparent member that faces the sensing module, and the sensing module may include a light emitting element including light emitting circuitry. The light receiving sensor may be aligned with a first area corresponding to a first direction with respect to the light blocking member, and the light emitting element may be aligned with a second area corresponding to a second direction opposite the first direction with respect to the light blocking member.

According to various example embodiments, a light blocking layer may be located inside the transparent member, and the sensing module may include a light emitting element including light emitting circuitry. The light receiving sensor may be aligned with a first area corresponding to a first direction with respect to the light blocking layer, and the light emitting element may be aligned with a second area corresponding to a second direction opposite the first direction with respect to the light blocking layer.

According to various example embodiments, the portable communication device may further include another support configured to support the support member and comprising a rigid material, and another opening at least partially aligned with the opening may be formed in part of the other support member.

According to various example embodiments, the portable communication device may include a transparent member comprising a transparent material attached to an inner surface of the other opening of the other support or attached around the other opening of the other support.

According to various example embodiments, at least portion of the sensing module may be accommodated in the other opening such that an upper surface of the sensing module is located above a lower surface of the other support.

According to various example embodiments, the opening may include a first opening and a second opening spaced apart from the first opening, and the sensing module may further include a light emitting element comprising light emitting circuitry. The light receiving sensor may be aligned with the first opening, and the light emitting element may be aligned with the second opening.

According to various example embodiments, a pattern including one or more openings or one or more recesses may be formed in the second area.

As described above, an electronic device according to an example embodiment may include: a first housing, a second housing, a hinge housing disposed between the first housing and the second housing, a hinge coupled with the first housing and the second structure, at least portion of the hinge being disposed in the hinge housing, a display panel, at least portion of which is disposed on the first housing and the second housing, a first support disposed under the display panel and including a first opening, a second support disposed under the first support and including a second opening, a sensor module including at least one sensor configured to receive a signal required for sensing through the first opening, the second opening, and the display panel, and a reinforcing support disposed between the display panel and the sensor module.

According to various example embodiments, at least portion of the reinforcing support may be brought into close contact with a rear surface of the display panel.

According to various example embodiments, the reinforcing support may have a specified transmittance or transparency.

According to various example embodiments, the reinforcing support may include at least one through-hole through which a signal received by the sensor module is delivered.

According to various example embodiments, the first opening may be larger than the second opening.

According to various example embodiments, the electronic device may further include an adhesive layer disposed between the reinforcing support and the rear surface of the display panel.

According to various example embodiments, at least portion of the sensor module may be disposed in the first opening.

According to various example embodiments, the electronic device may further include an adhesive disposed in at least a partial area between the reinforcing support and the first support having the first opening formed therein.

According to various example embodiments, the sensor module may include at least one of an illuminance sensor, a proximity sensor, or a fingerprint recognition sensor.

According to various example embodiments, the reinforcing support may be disposed in the second opening.

According to various example embodiments, the electronic device may further include an adhesive disposed in at least a partial area between the reinforcing support and the second support having the second opening formed therein.

According to various example embodiments, the sensor module may be disposed under the second support and may be configured to transmit and receive a signal for sensing through the second opening, the first opening, and the display panel.

According to various example embodiments, the electronic device may further include a height adjustment part disposed between the reinforcing support and the second support.

According to various example embodiments, the reinforcing support may have a size greater than a size of the second opening.

According to various example embodiments, the reinforcing support may include two equal portions disposed side by side with a gap therebetween, and surfaces of the two portions that face each other may be painted.

According to various example embodiments, the electronic device may include a noise prevention portion disposed between the reinforcing support and the sensor module configured to absorb at least portion of a signal reflected between the sensor module and the reinforcing member.

As described above, an electronic device according to an example embodiment may include a display panel, a first support disposed under the display panel including a first opening, a second support disposed under the first support and including a second opening having a section, at least portion of which is stepped, a sensor module disposed under the second opening, and a reinforcing member disposed in the second opening.

According to various example embodiments, the reinforcing support may have a stepped shape.

According to various example embodiments, the reinforcing support may be formed such that the area of a section of an area disposed close to the display panel is less than an area of a section of an area disposed close to the second support.

According to various example embodiments, the reinforcing support may have a specified transmittance.

According to various example embodiments, the electronic device may further include a blocking member including a noise blocking material disposed between the reinforcing member and the sensor module and configured to block noise.

According to the various example embodiments, the structure capable of absorbing an external force applied to the front surface of the display may be disposed between the various sensors and the display to minimize and/or reduce shocks applied to the display and the various sensors by the external force.

Furthermore, according to the various example embodiments, the foldable electronic device may complement the stiffness of the flexible display and the front plate even though the flexible display and the front plate (e.g., a polyimide (PI) film) made of a flexible material are applied to the foldable electronic device.

In addition, the disclosure may provide various effects that are directly or indirectly recognized.

While the disclosure has been illustrated and described with reference to various example embodiments, it will be understood that the various example embodiments are intended to be illustrative, not limiting. It will be further understood by those skilled in the art that various changes in form and detail may be made without departing from the true spirit and full scope of the disclosure, including the appended claims and their equivalents.

What is claimed is:

1. An electronic device comprising:
   a first housing;
   a second housing;
   a hinge coupled with the first housing and the second housing;
   a display including a display panel and a front panel, at least portion of the display panel is disposed on the first housing and the second housing, and the front panel is flexible and disposed over the display panel to bend with the display panel;
   a cushion layer disposed below the display panel, the cushion layer including: a first cushion portion below a first display portion of the display disposed on the first housing, a second cushion portion extended from the first cushion portion in the first direction and disposed below a second display portion of the display disposed on the second housing, the second cushion portion including a first opening formed therein, and a third cushion portion extended from the first cushion portion in the second direction and disposed below a third display portion between the first display portion and the second display portion;
   a first plate disposed on the first housing and the second housing to support the display panel, the first plate including a second opening which is at least partially aligned with the first opening;
   a second plate disposed on the first housing to support the first plate, the second plate including a third opening formed in the second plate and at least partially being aligned with a second opening;
   a sensor module including at least one sensor configured to receive a signal through the first opening, the second opening, the third opening, and the display panel; and
   a transparent member disposed between the first plate and the sensor module,
   wherein at least portion of the second plate is disposed under at least the transparent member,
   wherein the transparent member is adhesively attached at the first plate so that the transparent member and the first support member are configured to absorb and/or distribute external force to be applied to a front surface of the display panel.

2. The electronic device of claim 1, wherein a corner of the third opening of the second plate is contacted to a rear surface of the transparent member.

3. The electronic device of claim 1, wherein the third opening forms a stepped shape.

4. The electronic device of claim 3, wherein the transparent member is accommodated in the stepped shape of the third opening.

5. The electronic device of claim 1, wherein the sensor module includes a light receiving sensor configured to sense an illuminance.

6. The electronic device of claim 5, wherein the sensing module includes a light emitting element including light emitting circuitry,
   wherein the light receiving sensor is located adjacent to the light emitting element.

7. The electronic device of claim 1, wherein the lattice pattern is formed at least in a location corresponding to a location of the hinge.

8. The electronic device of claim 1, wherein a size of the transparent member is bigger than a size of the second opening.

9. The electronic device of claim 1, further comprises an adhesive member disposes between at least portion of the first plate and at least portion of the second plate.

10. The electronic device of claim 1, wherein the front panel includes at least one of PI (poly-imide) film or UTG (ultra-thin-glass).

11. The electronic device of claim 1, wherein the transparent member is attached to the first plate via an adhesive member.

12. The electronic device of claim 1, wherein the transparent member is disposed adjacent to a rear side of the first opening of the first plate.

13. The electronic device of claim 1, wherein the lattice pattern has at least one of: a plurality of openings, a grid structure including a plurality of gaps or cracks, a grid structure by a plurality of lattices, a grid structure by a plurality of slits, or a structure including at least one recess partly having a smaller thickness than a surrounding area.

14. A portable communication device comprising:
   a housing including a first housing portion and a second housing portion;
   a flexible display accommodated in the first housing portion and the second housing portion, the flexible display including:
     a first display portion configured to be bent when the housing is folded;
     a second display portion extended from the first display portion in a first direction and configured to remain substantially planar when the housing is folded; and
     a third display portion extended from the first display portion in a second direction and configured to remain substantially planar when the housing is folded;
   a cushion layer located under the flexible display, the cushion layer including:
     a first cushion portion located under the first display portion;
     a second cushion portion extended from the first cushion portion in the first direction and located under the second display portion, the second cushion portion including a first opening formed therein and having a first width; and a third cushion portion extended from the first cushion portion in the second direction and located under the third display portion;

a conductive plate accommodated in the housing under the cushion layer, the conductive plate including:

a first conductive portion located under the first cushion portion, the first conductive portion including a second opening and a third opening forming at least part of a pattern configured to provide flexibility to the first conductive portion, a second width of the second opening substantially identical with a third width of the third opening when viewed in a third direction substantially parallel with a folding axis of the flexible display;

a second conductive portion extended from the first conductive portion in the first direction and located under the second cushion portion, the second conductive portion including a fourth opening substantially aligned with the first opening and having a fourth width larger than the second width and the third width when viewed in the third direction; and a third conductive portion extended from the first conductive portion in the second direction and located under the third cushion portion, no opening formed in substantially entire area of the third conductive portion;

a transparent member accommodated in the housing under the fourth opening and attached to an area of the second conductive portion surrounding the fourth opening; and a light sensing module accommodated in the housing under the transparent member as substantially aligned with the first opening and the fourth opening.

15. The portable communication device of claim 14, wherein the light sensing module including:

a transmitting member substantially aligned with a first portion of the transparent member and configured to transmit a light through the first portion of the transparent member, the fourth opening, the first opening, and the second display portion; and a receiving member substantially aligned with a second portion of the transparent member and configured to receive the light as reflected by an external object through the second display portion, the first opening, the fourth opening, and the second portion of the transparent member.

16. The portable communication device of claim 15, further comprising:

a light blocking member located between the transparent member and the light sensing module, wherein, when viewed in the third direction, the transmitting member is located in a fourth direction with respect to the light blocking member, and the receiving member is located in a fifth direction with respect to the light blocking member.

* * * * *